United States Patent
Kamoshida et al.

(10) Patent No.: US 8,451,648 B2
(45) Date of Patent: May 28, 2013

(54) RESISTANCE-CHANGE MEMORY AND METHOD OF OPERATING THE SAME

(75) Inventors: Masahiro Kamoshida, Yokohama (JP); Katsuaki Sakurai, Yokohama (JP); Takahiko Sasaki, Tokyo (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 175 days.

(21) Appl. No.: 13/181,949

(22) Filed: Jul. 13, 2011

(65) Prior Publication Data

US 2012/0014164 A1 Jan. 19, 2012

(30) Foreign Application Priority Data

Jul. 13, 2010 (JP) ................................. 2010-159098

(51) Int. Cl.
*G11C 11/00* (2006.01)

(52) U.S. Cl.
USPC ......................................................... 365/148

(58) Field of Classification Search
USPC .................. 365/51, 100, 148, 151, 154, 158, 365/163, 171, 184, 185.05, 185.22, 185.28, 365/189.06, 202, 209, 222, 225.7, 232; 438/3, 438/201, 210, 238, 240, 258, 582, 586, 597; 257/2, 4, 5, 22, 40, 48, 208, 209, 213, 288, 257/295, 296, 313, 315, 316, 324, 347, 351, 257/368, 406, 411, 421, 476, 516, 528, 532, 257/774
See application file for complete search history.

(56) References Cited

U.S. PATENT DOCUMENTS

2011/0051496 A1* 3/2011 Chi et al. ....................... 365/148

FOREIGN PATENT DOCUMENTS

JP 2009-230849 10/2009

OTHER PUBLICATIONS

U.S. Appl. No. 13/422,446, filed Mar. 16, 2012, Kamoshida.
U.S. Appl. No. 13/051,614, filed Mar. 18, 2011, Takahiko Sasaki, et al.
U.S. Appl. No. 12/885,013, filed Sep. 17, 2010, Hiroshi Kanno, et al.

* cited by examiner

*Primary Examiner* — Harry W Byrne
(74) *Attorney, Agent, or Firm* — Oblon, Spivak, McClelland, Maier & Neustadt, L.L.P.

(57) ABSTRACT

According to one embodiment, a resistance-change memory includes a memory element in which its variable resistance state corresponds to data to be stored therein, a pulse generation circuit which generates a first pulse, a second pulse, a third pulse, and a fourth pulse, the first pulse having a first amplitude which changes the resistance state of the memory element from a high- to a low-resistance state, the third pulse having a third amplitude smaller than the first amplitude to read data in the memory element, the fourth pulse having a fourth amplitude between the first amplitude and the third amplitude, and a control circuit which controls the operations of the memory element and the pulse generation circuit. The control circuit supplies the fourth pulse to the memory element after supplying the first pulse to the memory element.

20 Claims, 16 Drawing Sheets

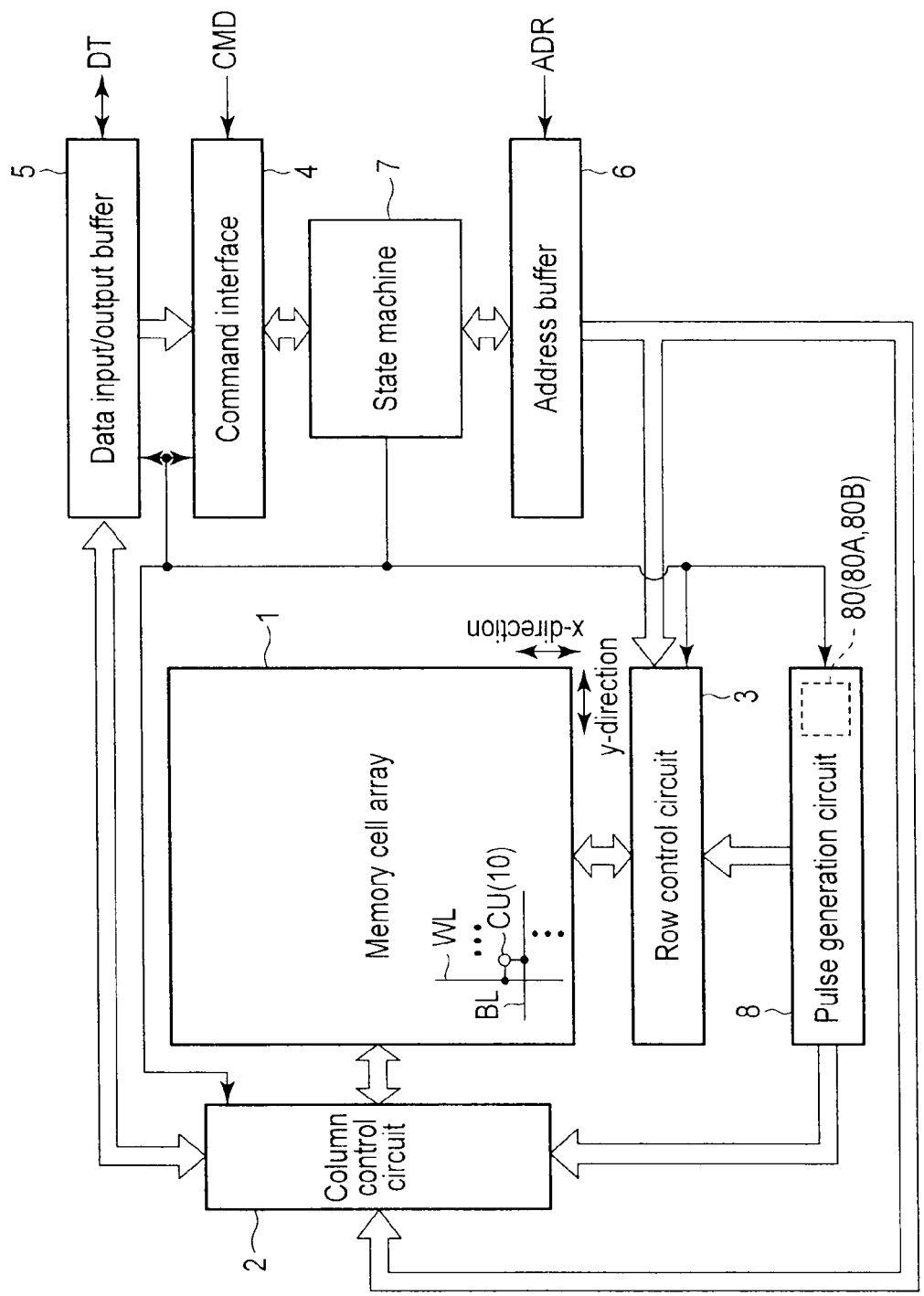
F I G. 1

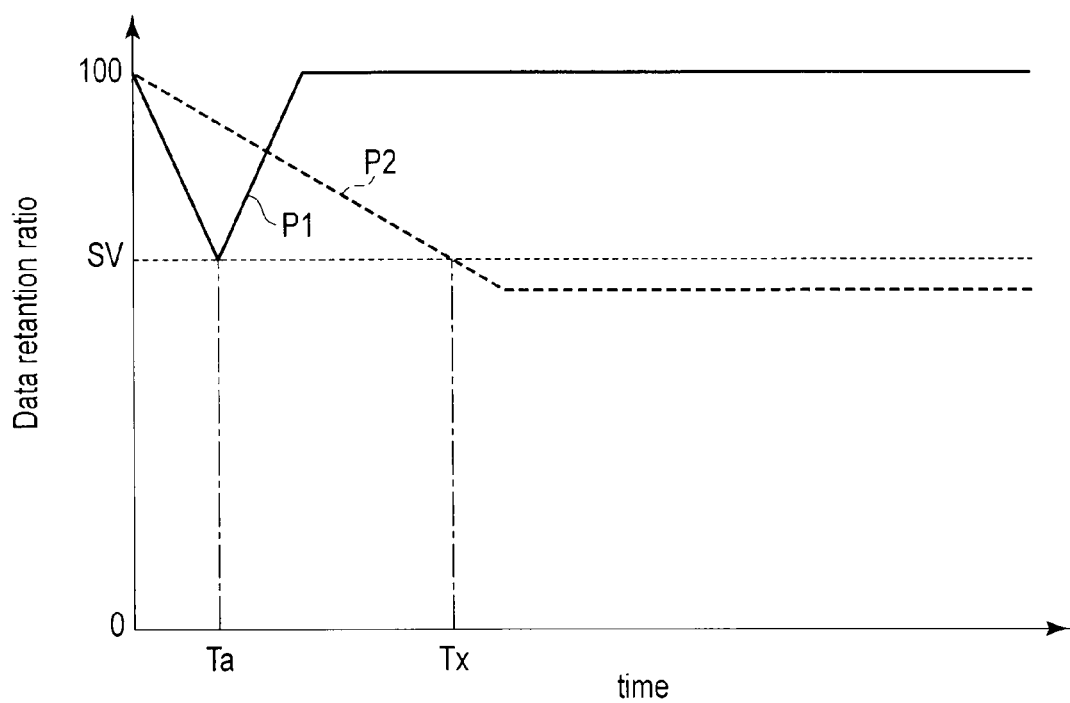
F I G. 10A

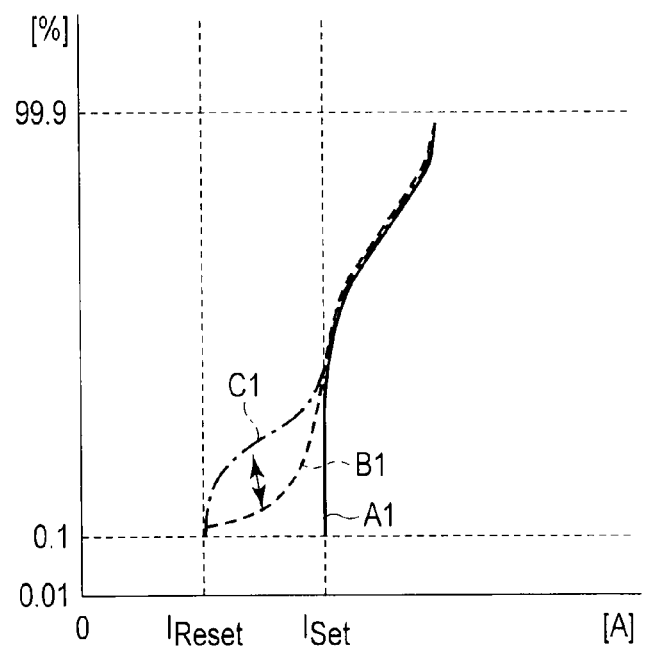
F I G. 10B
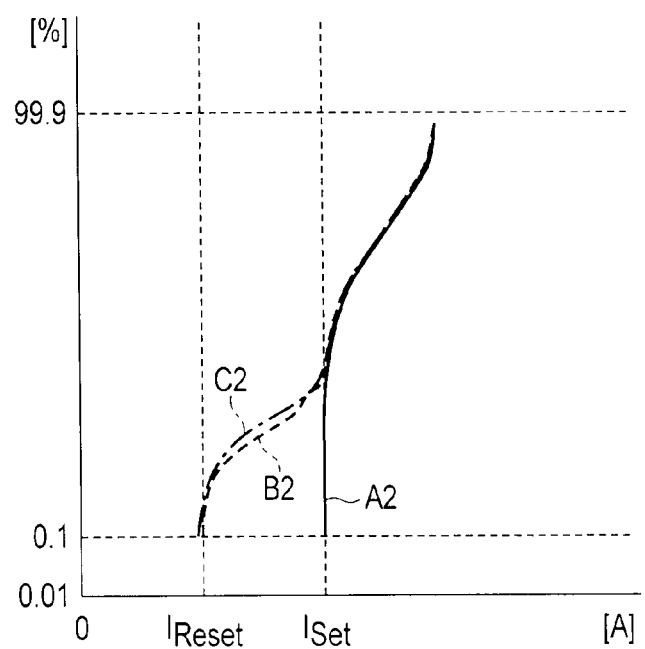
F I G. 10C

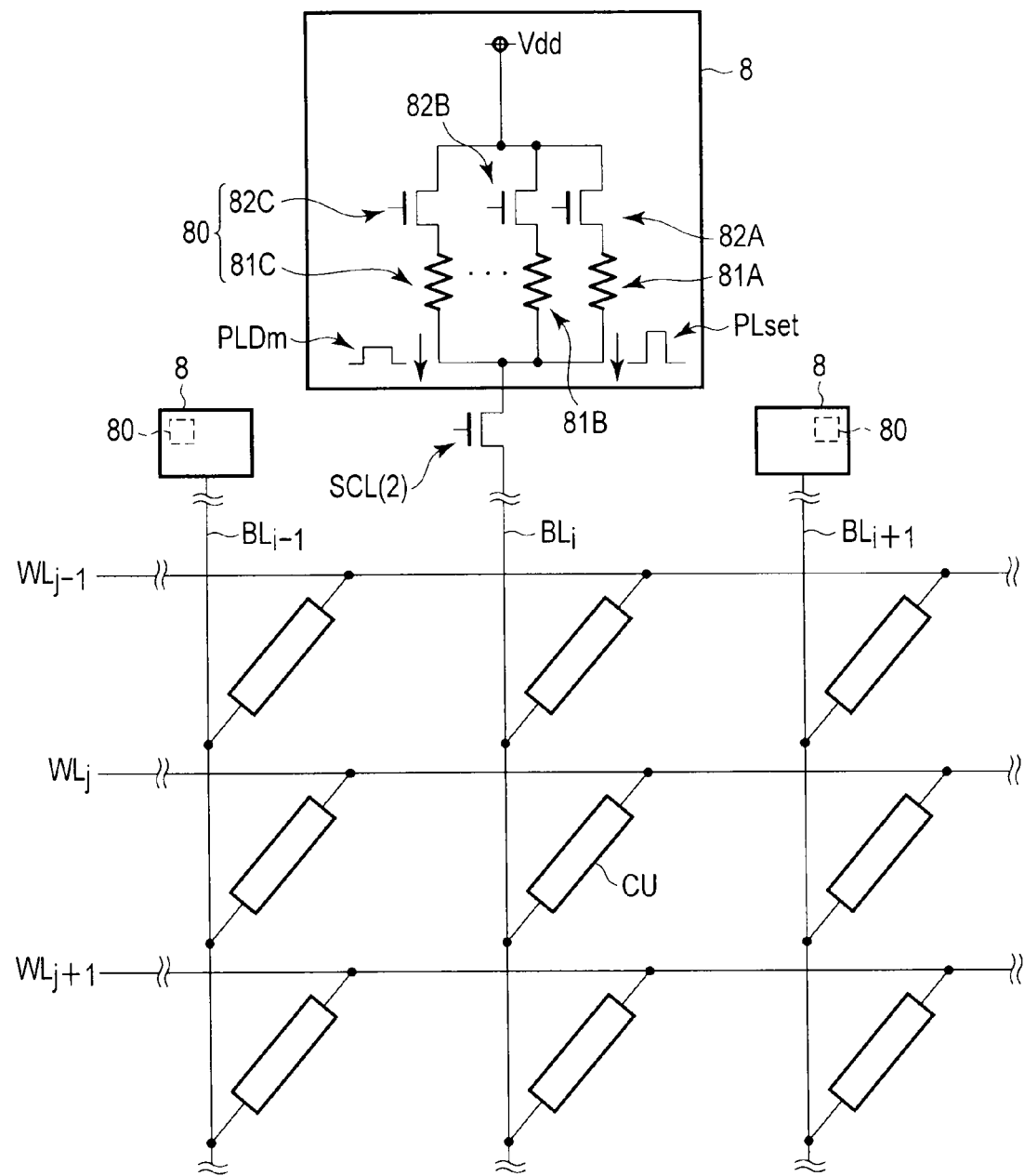
F I G. 11

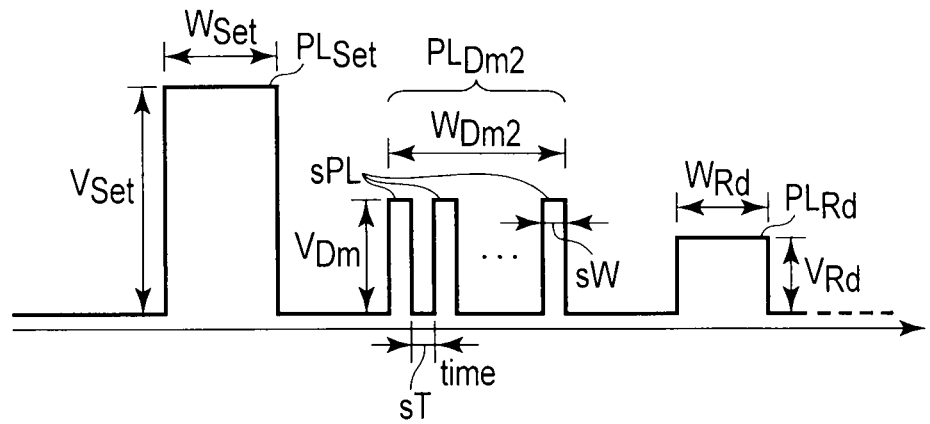
F I G. 12
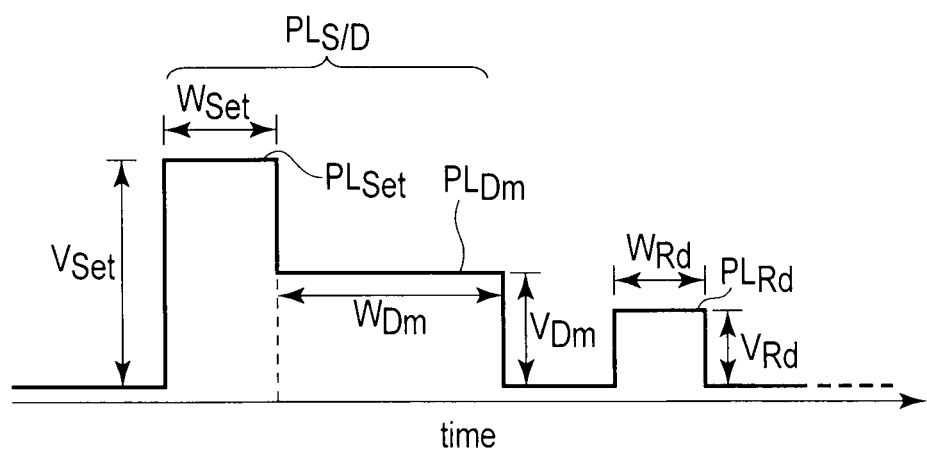
F I G. 13

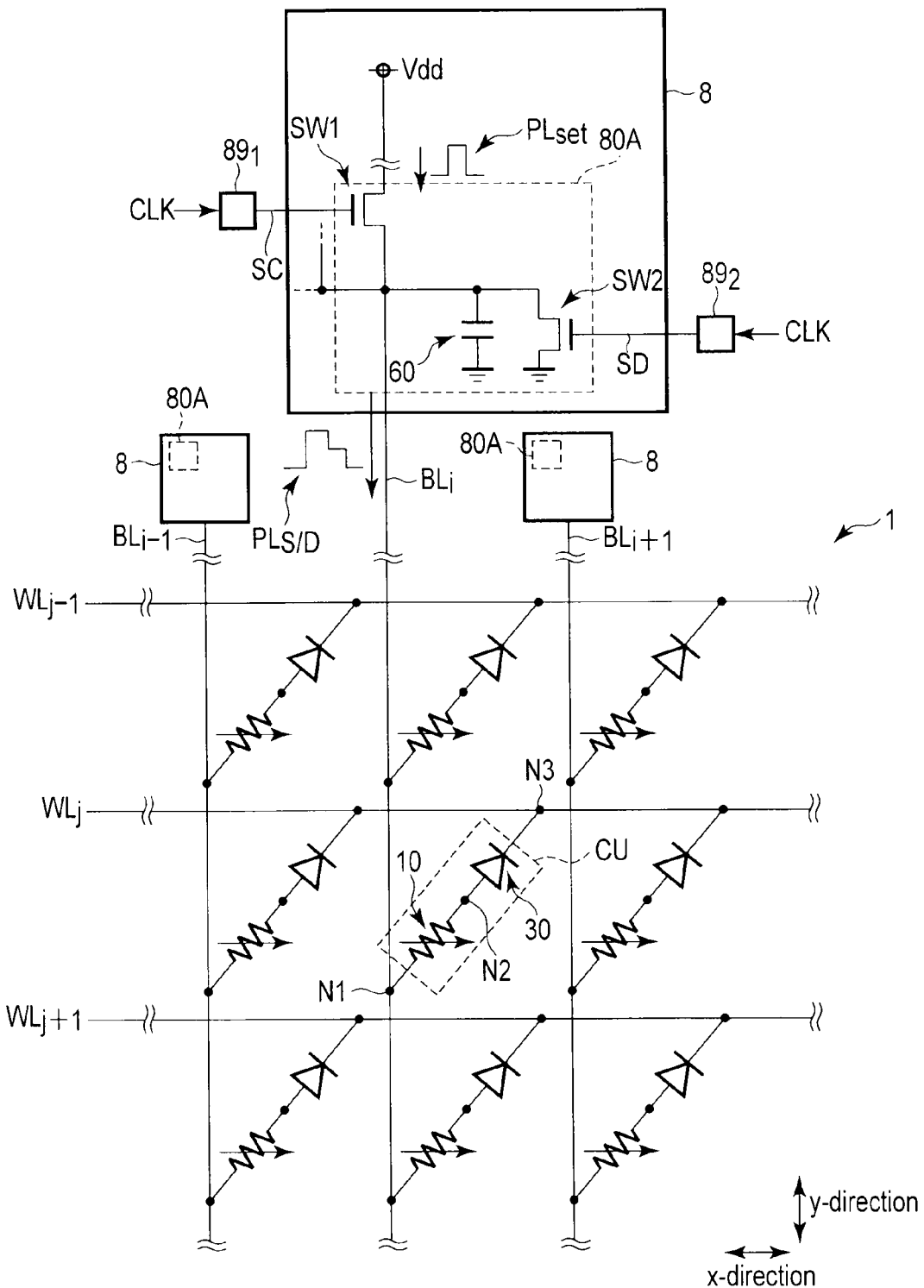
F I G. 14

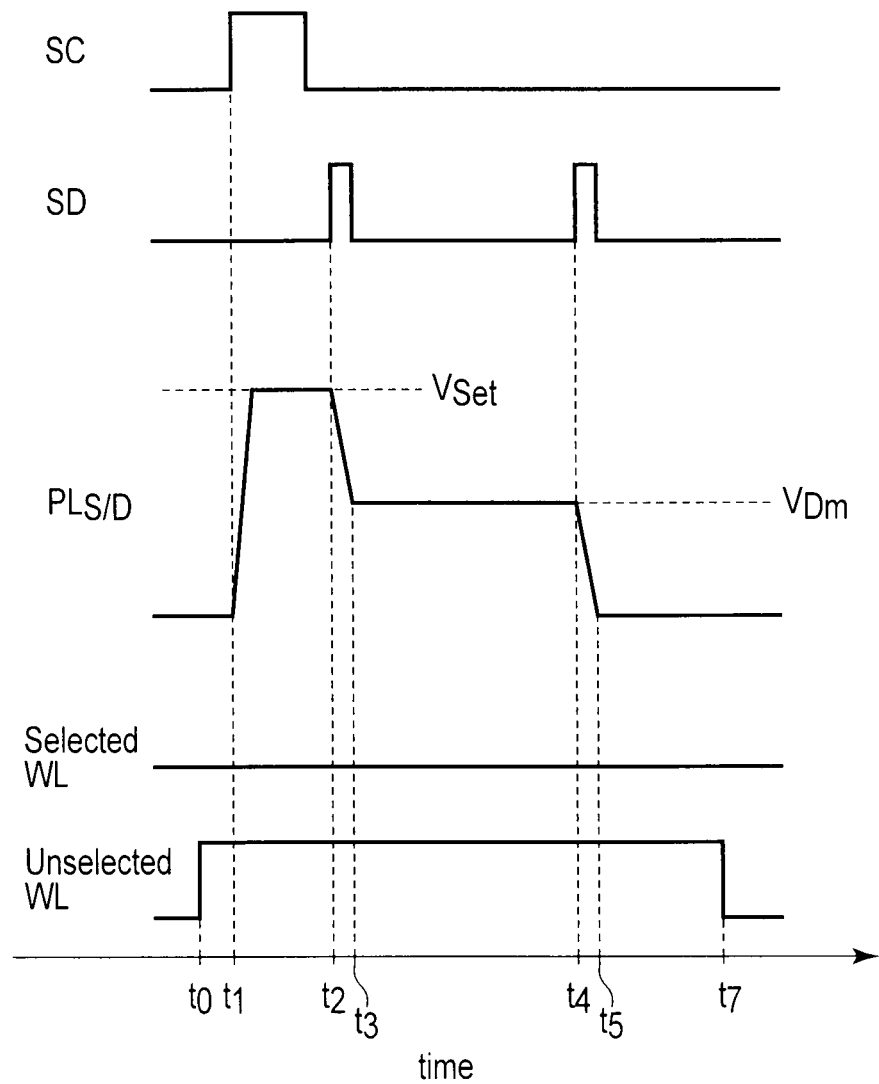
F I G. 15

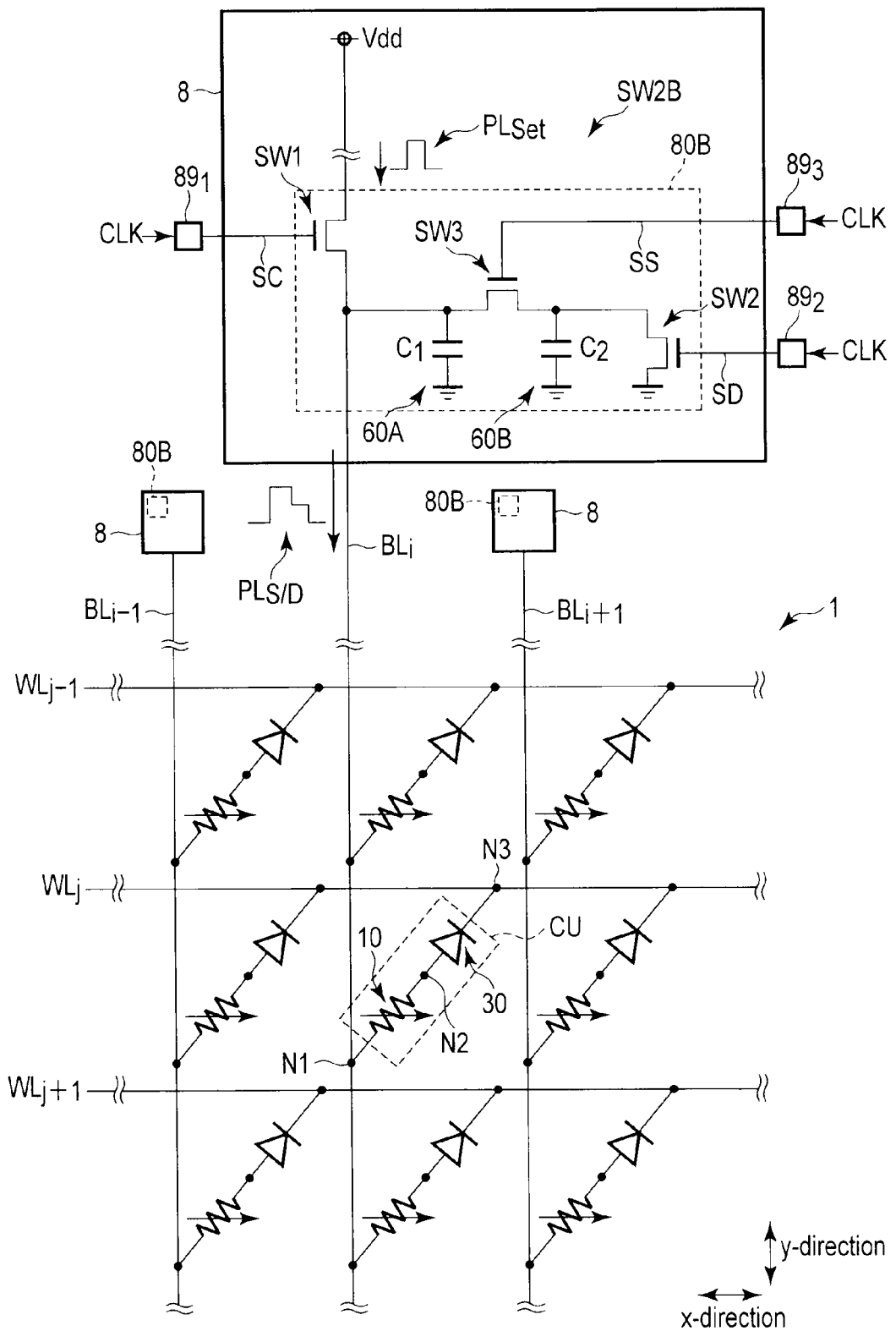
F I G. 16

RESISTANCE-CHANGE MEMORY AND METHOD OF OPERATING THE SAME

CROSS-REFERENCE TO RELATED APPLICATIONS

This application is based upon and claims the benefit of priority from prior Japanese Patent Application No. 2010-159098, filed Jul. 13, 2010, the entire contents of which are incorporated herein by reference.

FIELD

Embodiments described herein relate generally to a resistance-change memory and a method of operating the same.

BACKGROUND

Recently, as next-generation nonvolatile semiconductor memories, resistance-change memories have been attracting attention, such as a resistive RAM (ReRAM) in which a variable-resistance element serves as a memory element, and a phase-change RAM (PCRAM) in which a phase-change element serves as a memory element.

These resistance-change memories relatively easily allow the miniaturization of elements, and enable a higher memory capacity by three-dimensional integration that uses a cross-point memory cell array. The resistance-change memories are also capable of the same high-speed operation as that of a DRAM.

The resistance-change memory having such characteristics, when put into practical use, can replace, for example, a flash memory as a file memory and a DRAM as a work memory. Accordingly, various configurations and operations of the resistance-change memories have been suggested.

For the practical use of the resistance-change memories, improvements in memory characteristics, such as higher-speed operation, higher reliability, and lower power consumption are demanded for the resistance-change memories.

BRIEF DESCRIPTION OF THE DRAWINGS

FIG. 1 is a block diagram showing an example of a chip configuration of a resistance-change memory;

FIG. 10A is a graph illustrating the operation of the resistance-change memory according to the embodiment;

FIG. 10B and FIG. 10C are graphs illustrating a dummy pulse of the resistance-change memory according to the embodiment;

FIG. 11 is an equivalent circuit diagram showing a circuit example of the resistance-change memory according to the first embodiment;

FIG. 12 is a pulse waveform chart showing an operation example of a resistance-change memory according to a second embodiment;

FIG. 13 is a pulse waveform chart showing an operation example of a resistance-change memory according to a third embodiment;

FIG. 14 is an equivalent circuit diagram showing a circuit example of the resistance-change memory according to the third embodiment;

FIG. 15 is a timing chart showing the operation of the circuit shown in FIG. 14;

FIG. 16 is an equivalent circuit diagram showing a circuit example of the resistance-change memory according to the third embodiment;

DETAILED DESCRIPTION

[Embodiments]

Figure 2:
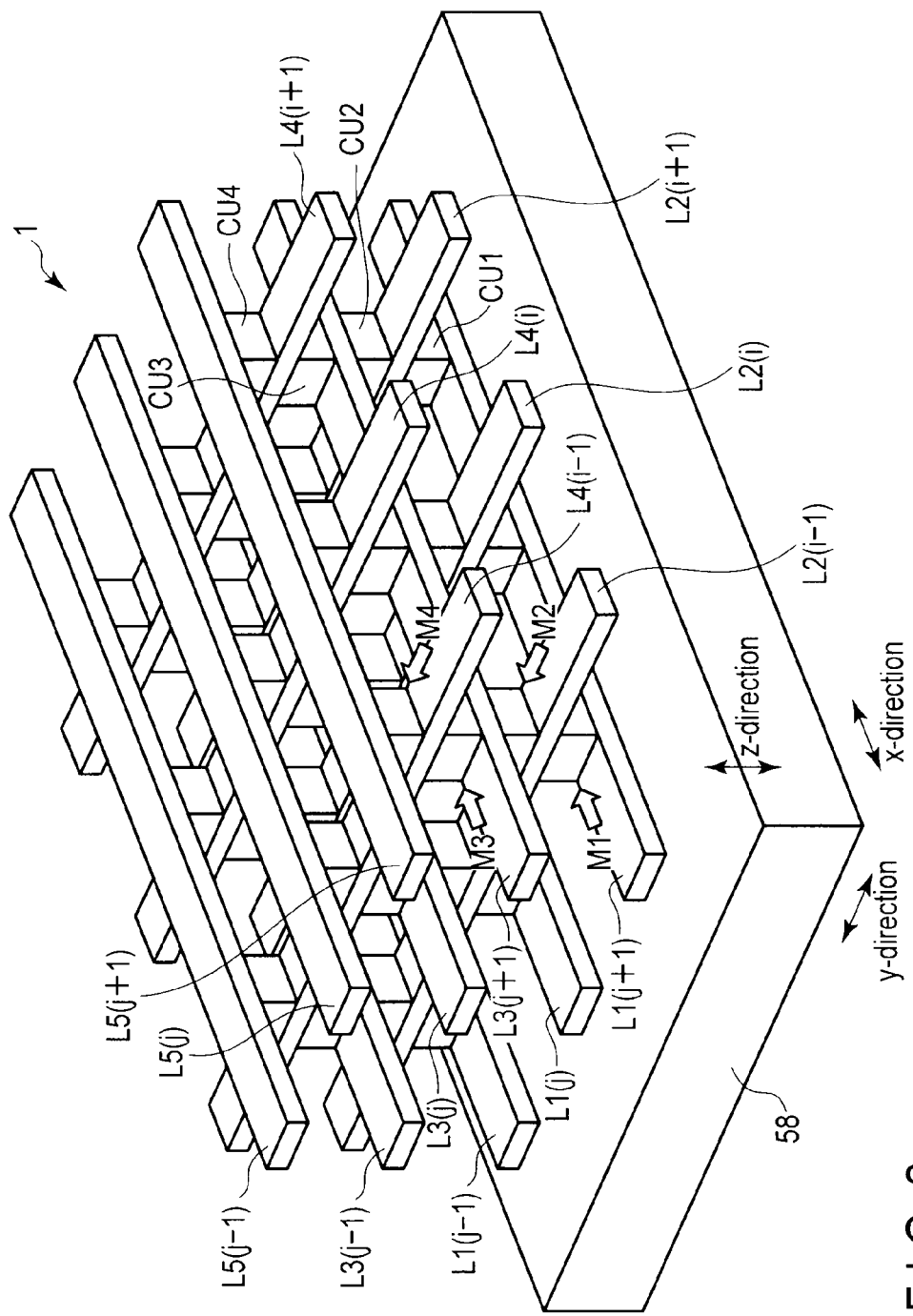
FIG. 2 is a bird's-eye view showing a structure example of a memory cell array.

Hereinafter, embodiments will be described in detail with reference to the drawings. In the following explanation, elements having the same function and configuration are provided with the same signs and are repeatedly described when necessary.

In general, according to one embodiment, a resistance-change memory includes first and second control lines, a memory element which is connected between the first and second control lines and in which its variable resistance state corresponds to data to be stored therein, a pulse generation circuit which generates a first pulse, a second pulse, a third pulse, and a fourth pulse, the first pulse having a first amplitude which changes the resistance state of the memory element from a high- to a low-resistance state, the second pulse having a second amplitude which changes the resistance state of the memory element from a low- to a high-resistance state, the third pulse having a third amplitude smaller than the first amplitude to read data in the memory element, the fourth pulse having a fourth amplitude between the first amplitude and the third amplitude, and a control circuit which controls the operations of the memory element and the pulse generation circuit. The control circuit supplies the fourth pulse to the memory element after supplying the first pulse to the memory element.

(A) First Embodiment

A resistance-change memory according to a first embodiment is described with reference to FIG. 1 to FIG. 11. The resistance-change memory according to the following embodiment is, for example, a resistive RAM (ReRAM) or a phase-change RAM (PCRAM).

(1) Overall Configuration

The overall configuration of the resistance-change memory according to the first embodiment is described with reference to FIG. 1.

FIG. 1 shows a configuration example of a chip of the resistance-change memory according to the present embodiment.

A memory cell array 1 has cell units CU. Each of the cell units CU includes a least one resistance-change memory element 10. Bit lines BL and word lines WL are provided in the memory cell array 1. The cell units CU are connected to the bit lines (first control lines) BL and word lines (second control lines) WL. The connection of the cell units CU to the bit lines BL and word lines WL varies depending on the internal configuration of the memory cell array 1.

A column control circuit 2 controls the driving state of the bit lines BL, that is, the application of a potential or the supply of a current to the bit lines BL. The column control circuit 2 includes a transfer transistor (a column selection switch), a sense amplifier, a latch circuit, or a buffer. The column control circuit 2 selects a bit line indicated by an externally input column address signal, and activates this bit line.

A row control circuit 3 controls the operation of the word lines WL, that is, the application of a potential or the supply of a current to the word lines WL. The row control circuit 3 includes a transfer transistor (row selection switch) or a switching element. The row control circuit 3 selects a word line indicated by an externally input row address signal, and activates this word line.

The bit line BL is controlled by the column control circuit 2, and the word line WL is controlled by the row control circuit 3 so that data is written, read or erased in the resistance-change memory element 10 connected to the word line WL and bit line BL.

On receipt of a command signal CMD from an external device such as a host device, a command interface 4 transfers the command signal CMD to a state machine 7. The command signal CMD indicates, for example, a data write command, a data read command or a data erase command.

A data input/output buffer 5 temporarily retains input or output data DT. The data input/output buffer 5 transfers the externally input write data DT to the memory cell array 1 via, for example, the column control circuit 2. The data input/output buffer 5 also externally transfers the data DT read from the memory cell array.

For example, an address signal ADR is externally input to an address buffer 6. The address signal ADR indicates, for example, an address (selected address signal) of a selected resistance-change memory element (selected cell unit). The address buffer 6 transfers, to the column control circuit 2, an address (column address signal) of the bit line included in the address signal ADR. The address buffer 6 also transfers, to the row control circuit 3, an address (row address signal) of the word line included in the address signal ADR.

The state machine (control circuit) 7 manages and controls the operation of the whole chip. On receipt of the command signal CMD transferred from the command interface 4, the state machine 7 controls the operation of the other circuits 2 to 8 in accordance with the command signal CMD. The state machine 7 also transfers, for example, status information to the host device outside the chip. On the basis of the status information, the host device determines whether the operation result is appropriate.

A pulse generation circuit (pulse generator) 8 is provided in the chip. The pulse generation circuit 8 is controlled by the state machine 7. For example, the pulse generation circuit 8 generates pulses to be supplied to the bit lines BL and word lines WL.

For example, the resistance-change memory switches the resistance state of the resistance-change memory element in accordance with a voltage (also referred to as a voltage pulse) having a predetermined pulse shape (magnitude and pulse width). When data is written to the resistance-change memory element 10 or when data is read from the resistance-change memory element 10, the pulse generation circuit 8 supplies the generated pulse to a selected bit line and a selected word line via the column control circuit 2 or the row control circuit 3. Further, the pulse generation circuit 8 generates a pulse (e.g., an unselect potential) to be supplied to unselected bit lines and unselected word lines.

Instead of the voltage pulse, a current (referred to as a current pulse) having a predetermined pulse shape (magnitude and pulse width) may be supplied to the bit line BL and word line WL.

(2) Memory Cell Array

A configuration example of the memory cell array 1 in the resistance-change memory shown in FIG. 1 is described with reference to FIG. 2 to FIG. 6.

FIG. 2 is a bird's eye view showing the structure of the memory cell array 1 of the resistance-change memory according to the present embodiment. For example, the resistance-change memory has a cross-point type memory cell array. The cross-point type memory cell array 1 is provided on, for example, a substrate 58.

The cross-point type memory cell array 1 is formed by, for example, a stack structure of memory cell arrays (also referred to as memory cell layers).

FIG. 2 shows, by way of example, the case where the cross-point type memory cell array 1 includes four memory cell arrays M1, M2, M3, M4 that are stacked in a z-direction (a direction perpendicular to the main plane of the substrate 58). The number of memory cell arrays stacked has only to be two or more. However, the cross-point type memory cell array 1 may otherwise be formed by one memory cell array. Alternatively, an insulating film may be provided between two memory cell arrays stacked, and the two memory cell arrays may be electrically isolated by the insulating film.

When the memory cell arrays M1, M2, M3, M4 are stacked as in FIG. 2, the address signal ADR includes, for example, a memory cell array selection signal, a row address signal, and a column address signal. The column/row control circuits 2 and 3 select one of the stacked memory cell arrays in accordance with, for example, the memory cell array selection signal. The column/row control circuits 2 and 3 can write/erase/read data in one of the stacked memory cell arrays, or can simultaneously write/erase/read data in two or more or all of the stacked memory cell arrays.

Memory cell array M1 includes cell units CU1 arrayed in an x-direction and a y-direction. Similarly, memory cell array M2 includes arrayed cell units CU2, memory cell array M3 includes arrayed cell units CU3, and memory cell array M4 includes arrayed cell units CU4. Each of cell units CU1, CU2, CU3, and CU4 includes the resistance-change memory element 10 and a non-ohmic element.

On the substrate 58, there are arranged, in order from the side of the substrate 58 in the z-direction, control lines L1($j$−1), L1($j$), L1($j$+1), control lines L2($i$−1), L2($i$), L2($i$+1), control lines L3($j$−1), L3($j$), L3($j$+1), control lines L4($i$−1), L4($i$), L4($i$+1), and control lines L5($j$−1), L5($j$), L5($j$+1).

The odd interconnects (wiring lines) from the side of the substrate 58, that is, control lines L1($j$−1), L1($j$), L1($j$+1), control lines L3($j$−1), L3($j$), L3($j$+1) and control lines L5($j$−1), L5($j$), L5($j$+1) extend in the x-direction.

The even interconnects (wiring lines) from the side of the substrate 58, that is, control lines L2($i$−1), L2($i$), L2($i$+1) and control lines L4($i$−1), L4($i$), L4($i$+1) extend in the y-direction that intersects with the x-direction.

These control lines serve as the word lines WL or the bit lines BL.

The lowermost first memory cell array M1 is disposed between the first control lines L1($j$−1), L1($j$), L1($j$+1) and the second control lines L2($i$−1), L2($i$), L2($i$+1). Cell unit CU1 is disposed at the place where the first control lines make two-level crossings with respect to the second control lines.

In the write/erase operations and read operation for memory cell array M1, one of a group of control lines L1(j−1), L1(j), L1(j+1) and a group of control lines L2(i−1), L2(i), L2(i+1) serve as the word lines WL, and the other group serve as the bit lines BL.

Similarly, the memory cell arrays M2, M3, and M4 are disposed between the second control lines L2(i−1), L2(i), L2(i+1) and the third control lines L3(j−1), L3(j), L3(j+1), between the third control lines L3(j−1), L3(j), L3(j+1) and the fourth control lines L4(i−1), L4(i), L4(i+1), and between the fourth control lines L4(i−1), L4(i), L4(i+1) and the fifth control lines L5(j−1), L5(j), L5(j+1), respectively. Each of cell units CU2, CU3, and CU4 is disposed at the place where the stacked two control lines make two-level crossings with respect to each other.

When stacked memory cell arrays are isolated from each other in the respective layers by the insulating film, the control lines extending in the x-direction and y-direction are not shared by the two stacked memory cell arrays, and control lines serving as the word lines WL and bit lines BL are provided for each memory cell array in each layer.

Figure 3:
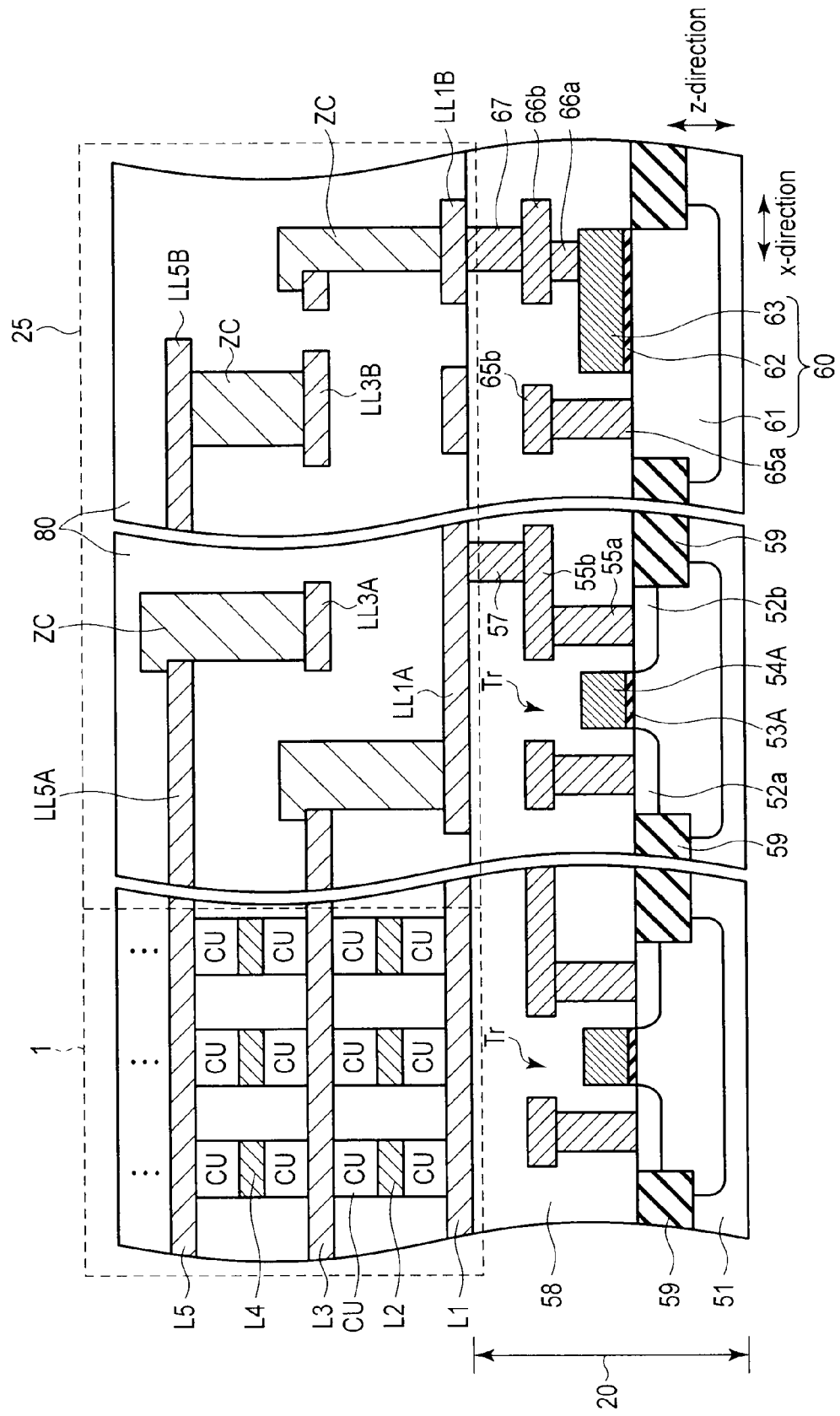
FIG. 3 is a diagram schematically showing the sectional structure of the resistance-change memory.

FIG. 3 is a diagram schematically showing the sectional structure of the resistance-change memory according to the present embodiment.

For example, when the resistance-change memory has the cross-point type memory cell array 1, the cross-point type memory cell array 1 is provided on an interlayer insulating film 58 located on a semiconductor substrate 51. In this case, the interlayer insulating film 58 serves as the substrate 58 for forming the cross-point type memory cell array 1.

In the present embodiment, a region on the semiconductor substrate 51 under the cross-point type memory cell array 1 is referred to as a peripheral region 20.

In the peripheral region 20, circuits (hereinafter referred to as peripheral circuits) for controlling the operation of the memory cell array, such as the state machine 7 and the pulse generation circuit 8 are provided. The peripheral circuit includes, as its components, a field-effect transistor Tr, a resistor, and a capacitor 60, for example.

The field-effect transistor Tr is formed in an active region defined by an isolation insulating film 59.

The field-effect transistor Tr has a source and a drain 52a and 52b, and a gate electrode 54A. Two diffusion layers 52a and 52b serving as the source and drain are provided in a well region (active region) of the semiconductor substrate 51. A gate insulating film 53A is provided on the surface (channel region) of the semiconductor substrate 51 between diffusion Layers 52a and 52b. The gate electrode 54A is provided on the gate insulating film 53A. Diffusion layer 52b is connected to an interconnect 55b via a contact 55a.

The capacitor 60 is formed in a predetermined region provided in the semiconductor substrate 51.

The capacitor 60 includes a semiconductor layer 61 serving as one end of the capacitor, a conductive layer 63 serving as the other end, and an insulating film (hereinafter referred to as a capacitor insulating film) 62 between the semiconductor layer 61 and the conductive layer 63.

The semiconductor layer 61 is an impurity layer (e.g., an N-type well region) provided in the semiconductor substrate 51. The semiconductor layer 61 may be an impurity layer having an impurity concentration higher than that of the well region. The capacitor insulating film 62 is provided on the impurity layer 61. The capacitor insulating film 62 is, for example, a silicon oxide film. The conductive layer 63 is provided on the capacitor insulating film 62. The conductive layer 63 is of the same material (structure) as the gate electrode 54A of the transistor Tr, such as polysilicon, silicide, or a stack structure of polysilicon and silicide.

The impurity layer 61 is connected to an interconnect 65b via a contact plug 65a. The conductive layer 63 is connected to an interconnect 66b via a contact plug 66a.

The capacitor 60 is, for example, a MOS capacitor. The capacitor 60 serves as, for example, a component of the pulse generation circuit 8.

The upper surface of the semiconductor substrate 51 and the components of the peripheral circuits are covered with the interlayer insulating film 58.

As described above, the cross-point type memory cell array 1 is provided on the interlayer insulating film (substrate) 58. The cell unit CU is provided between each of control lines L1, L3, and L5 extending in the x-direction and control lines L2 and L4 extending in the y-direction. The cell unit CU includes the resistance-change memory element and a non-ohmic element 30.

Adjacently to the cross-point type memory cell array 1, an interconnect region (also referred to as a hookup region) 25 is provided on the interlayer insulating film 58.

Control lines L1, L2, L3, L4, and L5 are drawn in the interconnect region 25. In the interconnect region 25, the line widths of control lines L1, L2, L3, L4, and L5, the interconnect pitch between adjacent interconnects, and interconnect layout are converted.

Interconnects LL1A, LL1B, LL3A, LL3B, LL5A, and LL5B in the interconnect region 25 extend in the interconnect region 25 from the memory cell array 1, for example, without being severed from the memory cell array 1. However, interconnects LL1, LL3, and LL5 in the interconnect region 25 may be independently provided in the interconnect region 25, and interconnects LL1, LL3, and LL5 may be connected, in the interconnect region 25, to control lines L1 and L2 drawn from the memory cell array 1 into the interconnect region 25. Portions of control lines L1, L2, L3, L4, and L5 provided in the interconnect region 25 are also referred to as interconnects LL1A, LL1B, LL3A, LL3B, LL5A, and LL5B.

In the interconnect region 25 adjacent to the memory cell array 1 in the x-direction, interconnects LL1A, LL1B, LL3A, LL3B, LL5A, and LL5B are located at the same interconnect level as control lines L1, L3, and L5, respectively. Interconnects LL1A, LL1B, LL3A, LL3B, LL5A, and LL5B are drawn at the respective interconnect levels in the interconnect region 25 to provide a predetermined layout.

Interconnects LL1A, LL1B, LL3A, LL3B, LL5A, and LL5B connect the memory cell array 1 and the peripheral circuits by a multilevel interconnection technique.

A contact plug ZC is embedded in an interlayer insulating film 80. The contact plug ZC is provided, for example, across the interconnect levels. The contact plug ZC connects interconnects LL1A, LL1B, LL3A, LL3B, LL5A, and LL5B at different interconnect levels.

The field-effect transistor Tr in the peripheral region 20 is connected to interconnect LL1A on the interlayer insulating film 58 by a via plug 57. Similarly, the capacitor 60 in the peripheral region 20 is connected to interconnect LL1B by a via plug 67.

As a result, the elements Tr and 60 formed on the semiconductor substrate 51 are connected to the memory cell array 1 formed on the interlayer insulating film 58 via interconnects LL1A, LL1B, LL3A, LL3B, LL5A, and LL5B and the contact plug ZC in the interconnect region 25.

Although the interconnect region adjacent to the memory cell array 1 in the x-direction is only shown in FIG. 3, it should be understood that an interconnect region adjacent to the memory cell array 1 in the y-direction is provided on the interlayer insulating film (substrate) 58. In the interconnect region adjacent in the y-direction, the interconnects are mainly provided at the same interconnect level as control lines L2 and L4.

It should be understood that depending on the interconnect layout of the resistance-change memory, interconnects at the same interconnect level as control lines L2 and L4 extending in the y-direction may be drawn in the interconnect regions 25 adjacent in the x-direction of the memory cell array 1.

As shown in FIG. 3, the peripheral circuit which controls the operation of the memory cell array 1 is formed on the semiconductor substrate 51 under the memory cell array 1 via the interlayer insulating film 58. The memory cell array 1 is thus stacked on the peripheral circuit (peripheral region 20), so that the chip size of the resistance-change memory can be reduced.

Figure 4:
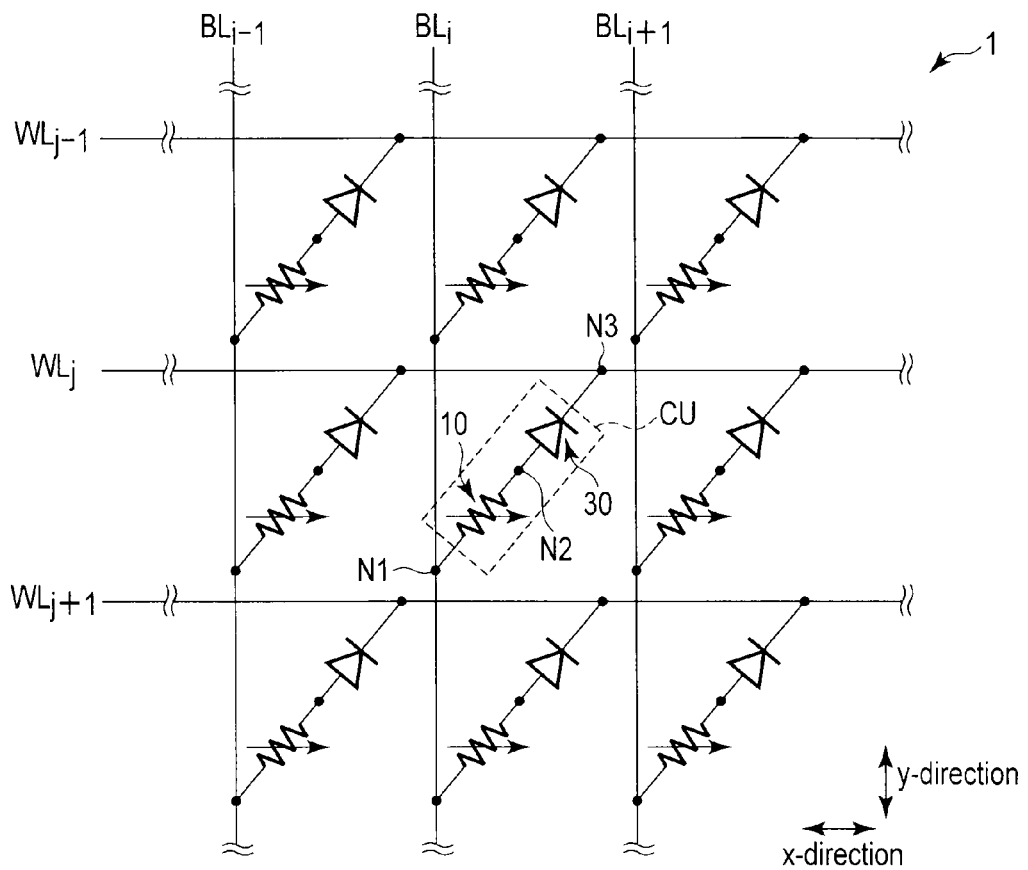
FIG. 4 is an equivalent circuit diagram showing a configuration example of the memory cell array.

FIG. 4 shows an example of an equivalent circuit of the cross-point memory cell array 1.

FIG. 4 shows an equivalent circuit of one memory cell array M1 included in the cross-point memory cell array 1.

Word lines (second control lines) $WL_{j-1}$, $WL_j$, $WL_{j+1}$ extending in the x-direction (first direction) are provided in the memory cell array 1. Word lines $WL_{j-1}$, $WL_j$, $WL_{j+1}$ are arranged in memory cell array M1 adjacently to one another in the y-direction.

Bit lines (second control lines) $BL_{i-1}$, $BL_i$, $BL_{i+1}$ extending in the y-direction (second direction) are also provided in memory cell array M1. Bit lines $BL_{i-1}$, $BL_i$, $BL_{i+1}$ are arranged in memory cell array M1 adjacently to one another in the x-direction.

The cell units CU including the resistance-change memory elements 10 are provided at the places where bit lines $BL_{i-1}$, $BL_i$, $BL_{i+1}$ make two-level crossings with respect to word lines $WL_{j-1}$, $WL_j$, $WL_{j+1}$.

The resistance (resistance state) of the resistance-change memory element 10 reversibly changes when energy such as a voltage, a current, or heat is supplied thereto. Using such characteristics, data corresponding to the resistance is written into the resistance-change memory element 10, and the written data is stored in the resistance-change memory element 10 substantially in a nonvolatile manner. The resistance-change memory element 10 is, for example, a two-terminal element having one end and the other.

One cell unit CU includes the resistance-change memory element 10 and the non-ohmic element 30. The resistance-change memory element 10 and the non-ohmic element 30 are connected in series between bit line $BL_i$ and word line $WL_j$.

The non-ohmic element 30 is provided to inhibit crosstalk caused to the cell units which are not targeted for operation (not selected) during the operation of the memory.

One example of the connection of the cell unit CU to bit lines $BL_{i-1}$, $BL_i$, $BL_{i+1}$ and word lines $WL_{j-1}$, $WL_j$, $WL_{j+1}$ shown in FIG. 4 is as follows. In the case described in the present embodiment, a diode (rectification element) serves as the non-ohmic element 30.

As shown in FIG. 4, one end of the resistance-change memory element 10 is connected to, for example, bit line $BL_i$, and this connection point is a connection node N1. The other end of the resistance-change memory element 10 is connected to, for example, the anode of the diode 30, and this connection point is a connection node N2. The cathode of the diode 30 is connected to, for example, word line $WL_j$, and this connection point is a connection node N3.

In the connection shown in FIG. 4, when the potential (e.g., a high level) applied to bit line $BL_i$ is higher than the potential applied to word line $WL_j$, a forward bias voltage is applied to the diode 30. When the potential applied to bit line $BL_i$ is lower than the potential applied to word line $WL_j$, a reverse bias voltage is applied to the diode 30.

The diode 30 has an asymmetric voltage-current characteristic. In a steady operation of the diode, a current flowing from the anode side to the cathode side during forward bias is high, and a current flowing from the cathode side to the anode side during reverse bias is much lower than the current during forward bias.

Figure 5:
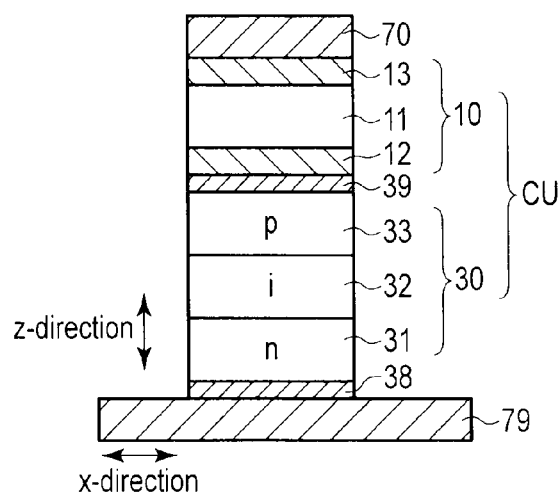
FIG. 5 and FIG. 6 are sectional views showing a structure example of a cell unit.
Figure 6:
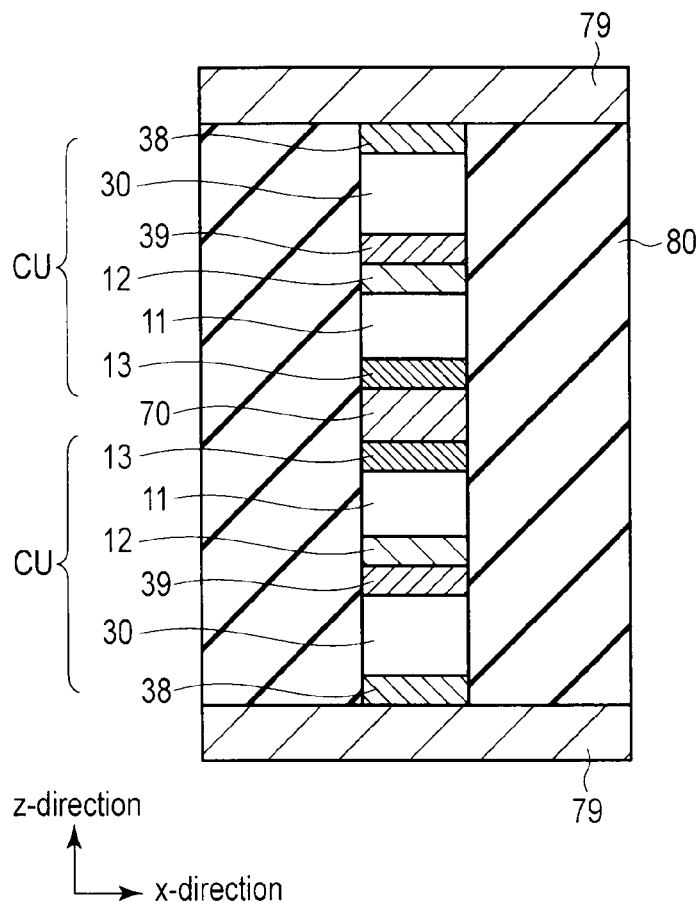

FIG. 5 and FIG. 6 show an example of the structure of a cell unit in the resistance-change memory according to the present embodiment.

FIG. 5 shows an example of the sectional structure of one cell unit. In the example shown in FIG. 5, the resistance-change memory element 10 is stacked on the non-ohmic element 30. As a result, the resistance-change memory element 10 and the non-ohmic element 30 are connected in series.

A stack of the resistance-change memory element 10 and the non-ohmic element 30 is interposed as one cell unit CU between two control lines 70 and 79. The cell unit CU is provided on control line 79, and control line 70 is provided on the cell unit CU.

The resistance-change memory element 10 is, for example, a variable-resistance element. Here, the variable-resistance element as the memory element 10 means an element including a material that reversibly changes its resistance when energy such as a voltage, a current or heat is applied thereto.

In the present embodiment, the variable-resistance element as the resistance-change memory element 10 includes, for example, a metal oxide (e.g., a binary or ternary metal oxide), a metal compound, organic matter, carbon, or carbon nanotube.

As methods of changing the resistance of the variable-resistance element as the resistance-change memory element 10, there are an operation called a bipolar operation and an operation called a unipolar operation.

In the bipolar operation, the polarity of a voltage applied to the resistance-change memory element 10 is changed to cause a reversible change in the resistance of the resistance-change memory element 10 between at least a first value (first level) and a second value (second level).

In the unipolar operation, one or both of the intensity and application time (pulse width) of a voltage is controlled without changing the polarity of the voltage applied to the memory element 10 to cause a reversible change in the resistance of the memory element between at least the first value and the second value.

On the basis of such an operation principle, the resistance state of the resistance-change memory element 10 changes from a high- to a low-resistance state or from a low- to a high-resistance state.

The resistance-change memory element 10 has electrode layers 12 and 13 on one end and the other. The electrode layer 12 is provided on the bottom of the resistance-change memory element 10 in the z-direction, and the electrode layer 13 is provided on the top of the resistance-change memory element 10 in the z-direction. The electrode layers 12 and 13 serve as, for example, electrodes of the resistance-change memory element. For the electrode layer 12 and 13, for example, a metal film, a metal compound film, a conductive semiconductor film or a stack of these films is used.

In the present embodiment, a portion interposed between two electrode layers 12 and 13 is called a resistance-change film 11. The resistance-change film 11 is made of a material that changes in its resistance with the production or disappearance of a micro current path (referred to as a filament)

formed in the resistance-change film 11 when energy such as a voltage, a current, or heat is supplied thereto.

The resistance-change film 11 may otherwise be made of a material having a property that changes in its resistance when ions that constitute the resistance-change film 11 are moved or the characteristics of an interface between the resistance-change film 11 and the electrode layers 12 and 13 are changed by the supplied energy.

The resistance changing property of the resistance-change memory element 10 may be stably obtained by properly setting the combination of the material used for the resistance-change film 11 and the material used for the electrode layers 12 and 13.

The electrode layers 12 and 13 may function as diffusion prevention layers. The diffusion prevention layer prevents impurities derived from the element 30 and control line 70 connected to the memory element 10 from diffusing into the resistance-change memory element 10, or prevents impurities derived from the resistance-change memory element 10 from diffusing into the element 30 and control lines 70 and 79. The electrode layers 12 and 13 may also function as adhesive layers for preventing the resistance-change memory element 10 from being detached from the lower element 30 and the control line.

The non-ohmic element (e.g., a diode) 30 is an element having no linearity in its input/output characteristics (voltage-current characteristics), that is, having non-ohmic characteristics in its input/output characteristics.

The non-ohmic element 30 has conductive layers 38 and 39 on one end and the other in the z-direction (stacking direction). The conductive layer 38 is provided on the bottom of the non-ohmic element 30. The conductive layer 39 is provided on the top of, for example, the non-ohmic element 30.

The conductive layers 38 and 39 serve as, for example, electrodes of the non-ohmic element 30. For the material of the conductive layers 38 and 39, for example, one of silicide, a metal, a metal compound, and a conductive semiconductor is used. Alternatively, the conductive layers 38 and 39 may be made of a stack of these materials.

In FIG. 5, a PIN diode is shown as an example of the non-ohmic element. The pin diode is a diode in which an intrinsic semiconductor layer is interposed between a P-type semiconductor layer (anode layer) and an N-type semiconductor layer (cathode layer).

In the structure shown in FIG. 5, a layer 32 intervening between two layers 31 and 33 is an intrinsic semiconductor layer 32. Of the two layers 31 and 33, one layer 33 is a P-type semiconductor layer, and the other layer 3 is an N-type semiconductor layer. The intrinsic semiconductor layer may contain no N-type or P-type impurity, and the impurity concentration of the intrinsic semiconductor layer may be sufficiently lower than the impurity concentrations of the N-type and P-type semiconductor layers.

The non-ohmic element 30 is not exclusively the pin diode shown in FIG. 5. A PN diode or a metal-insulator-semiconductor (MIS) diode may be used as the non-ohmic element 30 suitably to the operation required for the cell unit.

In accordance with the circuit configuration shown in FIG. 4, control line 79 is a word line and control line 70 is a bit line in the cell unit shown in FIG. 5. In the pin diode, the semiconductor layer 33 is a P-type semiconductor layer serving as an anode, and the semiconductor layer 31 is an N-type semiconductor layer serving as a cathode.

For example, in the cross-point memory cell array 1, two cell units CU face each other across one control line 70 in the stacking direction (z-direction), as shown in FIG. 6. The two cell units CU have a mirror structure with respect to control line 70 in the z-direction. More specifically, control line (e.g., bit line) 70 intervenes between two resistance-change memory elements 10 stacked in the z-direction, and the two resistance-change memory elements 10 are connected to the common control line 70.

Control line 79 (e.g., word line) intervenes between two non-ohmic elements 30 stacked in the z-direction, and the two non-ohmic elements 30 are connected to the common control line 79.

However, as long as the memory cell array can operate normally, the structures and positions of the elements 10 and 30 relative to control lines 70 and 79 are not limited to those shown in FIG. 5 and FIG. 6. Moreover, all the connections of the cell units to the bit and word lines are preferably the same in one memory cell array. However, provided the resistance-change memory can operate normally, the connection of the cell unit to the bit and word lines may vary in each of the stacked memory cell arrays.

(3) Operation

The operation of the resistance-change memory according to the present embodiment is described below with reference to FIG. 7 to FIG. 10C.

(a) Basic Operation

Figure 7:
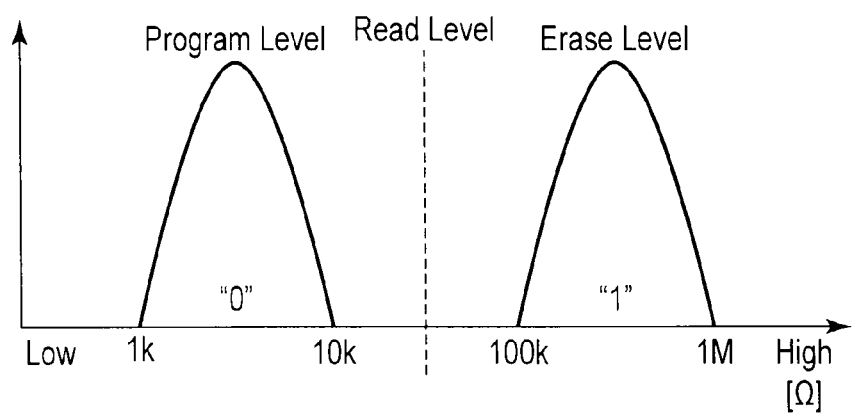
FIG. 7 is a graph illustrating the operation principle of the resistance-change memory.

FIG. 7 is a schematic diagram for illustrating the relationship between the resistance state of the resistance-change memory element (variable-resistance element) 10 and data. In FIG. 7, the abscissa represents the resistance state (resistance) of the resistance-change memory element, and the ordinate represents the existence probability (distribution) of the resistance-change memory element in a given resistance state.

The resistance-change memory element 10 is stored data depending on how high (great) its resistance is, and the resistance-change memory element 10 serves as a binary or multilevel memory.

As shown in FIG. 7, the binary memory (single-level cell [SLC]) stores one-bit data, namely, one of two values (0 or 1) depending on how high the resistance of the resistance-change memory element is.

In the example shown in FIG. 7, binary 0 is allocated to the distribution of the low-resistance state of the resistance-change memory element, and binary 1 is allocated to the distribution of the high-resistance state of the resistance-change memory element. For example, binary 0 is set as a write (program) level, and binary 1 is set as an erase level.

Data stored in the resistance-change memory element is determined by the comparison between the determination value (read level) and the resistance of the resistance-change memory element.

In the present embodiment, the operation of changing the resistance state of the resistance-change memory element from the low-resistance state (binary 0) to the high-resistance state (binary 1) is called a reset operation (erase operation), and the operation of changing the resistance state from the high-resistance state (binary 1) to the low-resistance state (binary 0) is called a set operation (write operation).

In FIG. 7, the range of the resistances corresponding to binary 0 is set at 1 to 10 k$\Omega$, and the range of the resistances corresponding to binary 1 is set at 100 to 1 k$\Omega$. However, the present embodiment is not limited thereto. The range of the resistances corresponding to the data may be properly set within the variable range of the resistance (resistance state) of the resistance-change memory element. It is obvious that the resistance corresponding to the data also varies depending on the material used for the resistance-change memory element and on the dimensions of the element.

Within the range of the resistance that can be taken by one resistance-change memory element, three or more write levels may be set in accordance with how high its resistance is. A memory in which one resistance-change memory element stores three or more values (two or more bits) of data is called a multilevel memory.

The data writing operation and reading operation of the resistance-change memory according to the present embodiment are described with reference to FIG. 8A and FIG. 8B. The resistance-change memory using the unipolar operation is given as an example, and the reset operation and the set operation of the resistance-change memory according to the present embodiment is described below.

In order to write data into the resistance-change memory element (selected cell unit) 10, energy such as a voltage or current is supplied to the resistance-change memory element 10 so that the resistance of the resistance-change memory element may be within the range of the resistance corresponding to the data to be written. As a result, the resistance state of the resistance-change memory element 10 reversibly changes, and the resistance-change memory element 10 stores data corresponding to the resistance state in a nonvolatile manner.

In the present embodiment, a pulse to change the resistance state of the resistance-change memory element from the high- to the low-resistance state is referred to as a set pulse, and a pulse to change the resistance state of the resistance-change memory element from the low- to the high-resistance state is referred to as a reset pulse (second pulse, erase pulse, or second write pulse).

Figure 8A:
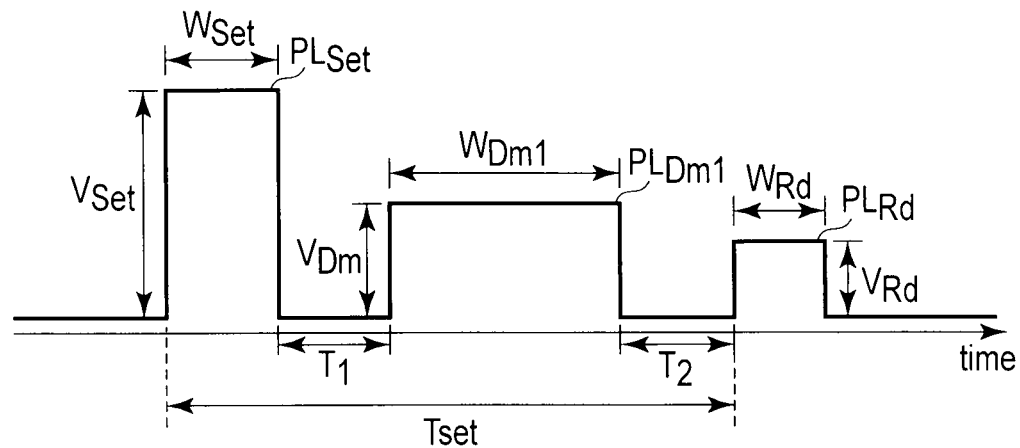
FIG. 8A and FIG. 8B are pulse waveform charts showing an operation example of the resistance-change memory according to a first embodiment.
Figure 8B:
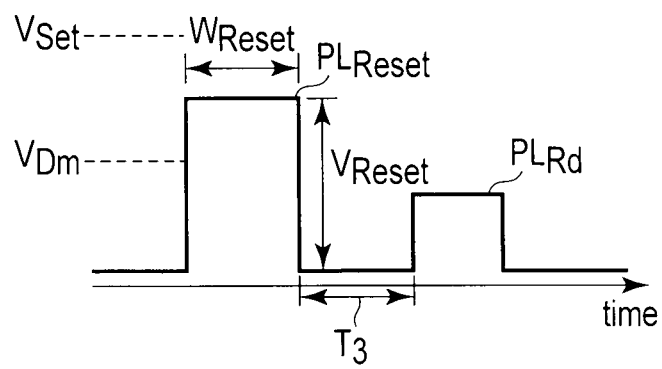

FIG. 8A and FIG. 8B show an example of the pulse shapes of pulses $PL_{Set}$, $PL_{Reset}$, $PL_{Rd}$, and $PL_{DM}$ ($PL_{DM1}$) in the set operation and the reset operation.

As shown in FIG. 8A, the set pulse (first pulse or first write pulse) $PL_{Set}$ has a predetermined amplitude (first amplitude) $V_{Set}$ and a predetermined pulse width (first pulse width) $W_{Set}$.

As shown in FIG. 8B, the reset pulse (second pulse, second write pulse, or erase pulse) $PL_{Reset}$ has a predetermined amplitude (second amplitude) $V_{Reset}$ and a predetermined pulse width (second pulse width) $W_{Reset}$.

The amplitude $V_{Set}$ of the set pulse $PL_{Set}$ is, for example, greater than the amplitude $V_{Reset}$ of the reset pulse $PL_{Reset}$.

The pulse width $W_{Reset}$ of the reset pulse $PL_{Reset}$ is, for example, greater than the pulse width $W_{Set}$ of the set pulse $PL_{Set}$. However, depending on the operation of the resistance-change memory and the kind of the resistance-change memory element 10, the pulse width $W_{Reset}$ of the reset pulse $PL_{Reset}$ may be the same as the pulse width $W_{Set}$ of the set pulse $PL_{Set}$, or the pulse width $W_{Reset}$ of the reset pulse $PL_{Reset}$ may be smaller than the pulse width $W_{Set}$ of the set pulse $PL_{Set}$.

In order to read data from the resistance-change memory element 10, the magnitude of a current flowing at a read node or the variation of the potential of the read node is detected when the read pulse $PL_{Rd}$ is supplied to the resistance-change memory element 10.

The read pulse (third pulse) $PL_{Rd}$ has an amplitude (third amplitude) $V_{Rd}$ and a pulse width (third pulse width) $W_{Rd}$. The amplitude $V_{Rd}$ of the read pulse $PL_{Rd}$ is smaller than the amplitude $V_{Set}$ of the set pulse $PL_{Set}$ and the amplitude $V_{Reset}$ of the reset pulse $PL_{Reset}$. For example, the pulse width $W_{Rd}$ of the read pulse $PL_{Rd}$ is smaller than the pulse width $W_{Set}$ of the set pulse $PL_{Set}$ and the pulse width $W_{Reset}$ of the reset pulse $PL_{Reset}$.

The amplitude $V_{Rd}$ and the pulse width $W_{Rd}$ of the read pulse $PL_{Rd}$ are set to such degrees that do not change the resistance state of the resistance-change memory element 10.

However, the amplitude $V_{Rd}$ and the pulse width $W_{Rd}$ of the read pulse $PL_{Rd}$ are preferably set to such degrees that permit the detection of the current/potential variation of the read node.

As shown in FIG. 8A, in the resistance-change memory according to the present embodiment, in the set operation, the set pulse $PL_{Set}$ is supplied to the resistance-change memory element 10, and then a pulse $PL_{Dm1}$ ($PL_{Dm}$) having a predetermined pulse shape is supplied to the resistance-change memory element 10 to which the set pulse $PL_{Set}$ has been applied. In the present embodiment, the pulse $PL_{Dm1}$ is referred to as a dummy pulse (fourth pulse or load pulse) $PL_{Dm1}$.

The pulse shape of the dummy pulse $PL_{Dm1}$ is different from those of the set pulse $PL_{Set}$, the reset pulse $PL_{Reset}$, and the read pulse $PL_{Rd}$.

The amplitude (fourth amplitude) $V_{Dm}$ of the dummy pulse $PL_{Dm1}$ is smaller than the pulse width $W_{Set}$ of the set pulse $PL_{Set}$ and greater than the amplitude $V_{Rd}$ of the read pulse $PL_{Rd}$.

A pulse width (fourth pulse width) $W_{Dm1}$ of the dummy pulse $PL_{Dm1}$ is, for example, greater than or equal to the pulse width $W_{Set}$ of the set pulse $PL_{Set}$. The pulse width $W_{Dm1}$ of the dummy pulse $PL_{Dm1}$ is, for example, greater than or equal to the pulse width $W_{Rd}$ of the read pulse $PL_{Rd}$. However, the pulse width $W_{Dm1}$ of the dummy pulse $PL_{Dm1}$ may be smaller than the pulse width $W_{Set}$ of the set pulse $PL_{Set}$ or the pulse width $W_{Rd}$ of the read pulse $PL_{Rd}$.

An amplitude $V_{Dm}$ of a dummy pulse $PL_{Dm1}$ is, for example, smaller than the amplitude $V_{Reset}$ of the reset pulse $PL_{Reset}$. The pulse width $W_{Dm1}$ of the dummy pulse $PL_{Dm1}$ is, for example, greater than or equal to the pulse width $W_{Reset}$ of the reset pulse $PL_{Reset}$. However, depending on the kind of the resistance-change memory element used in the resistance-change memory and the circuit configuration of the memory, the pulse width $W_{Dm1}$ of the dummy pulse $PL_{Dm1}$ may be smaller than the pulse width $W_{Reset}$ of the reset pulse $PL_{Reset}$.

The dummy pulse $PL_{Dm1}$ is generated by a dummy pulse generator 80 provided in the pulse generation circuit 8 in FIG. 1. The dummy pulse $PL_{Dm1}$ supplies a load onto the resistance-change memory element 10.

Although the pulses used for the operation of the memory are described as voltage pulses in the present embodiment, each of the pulses may be a current pulse if the above-mentioned relationship is satisfied. However, the current pulse as the set pulse needs to be great enough to change the resistance state of the resistance-change memory element from the high- to the low-resistance state. Similarly, the current pulse as the reset pulse needs to be great enough to change the resistance state of the resistance-change memory element from the low- to the high-resistance state. In the present embodiment, the magnitude of the amplitude (potential difference or current) of the pulse is compared by the absolute value of the amplitude.

In the resistance-change memory according to the present embodiment, the dummy pulse $PL_{Dm1}$ is supplied to the resistance-change memory element which is shifted to the low-resistance state by the set pulse $PL_{Set}$.

The load is supplied to the resistance-change memory element in the low-resistance state by the dummy pulse $PL_{Dm1}$ so that the resistance of the resistance-change memory element having poor data retention characteristics changes. As a result, the resistance-change memory elements that do not satisfy a predetermined specification (that have poor data retention characteristics) are extracted by the supply of the dummy pulse $PL_{Dm1}$.

Thus, the decrease of the data retention ratio of the resistance-change memory element is improved, and the operation of the resistance-change memory is improved in reliability.

Consequently, according to the resistance-change memory of the present embodiment, the operation characteristics of the resistance-change memory can be improved.

(b) Set Operation and Reset Operation

Figure 9:
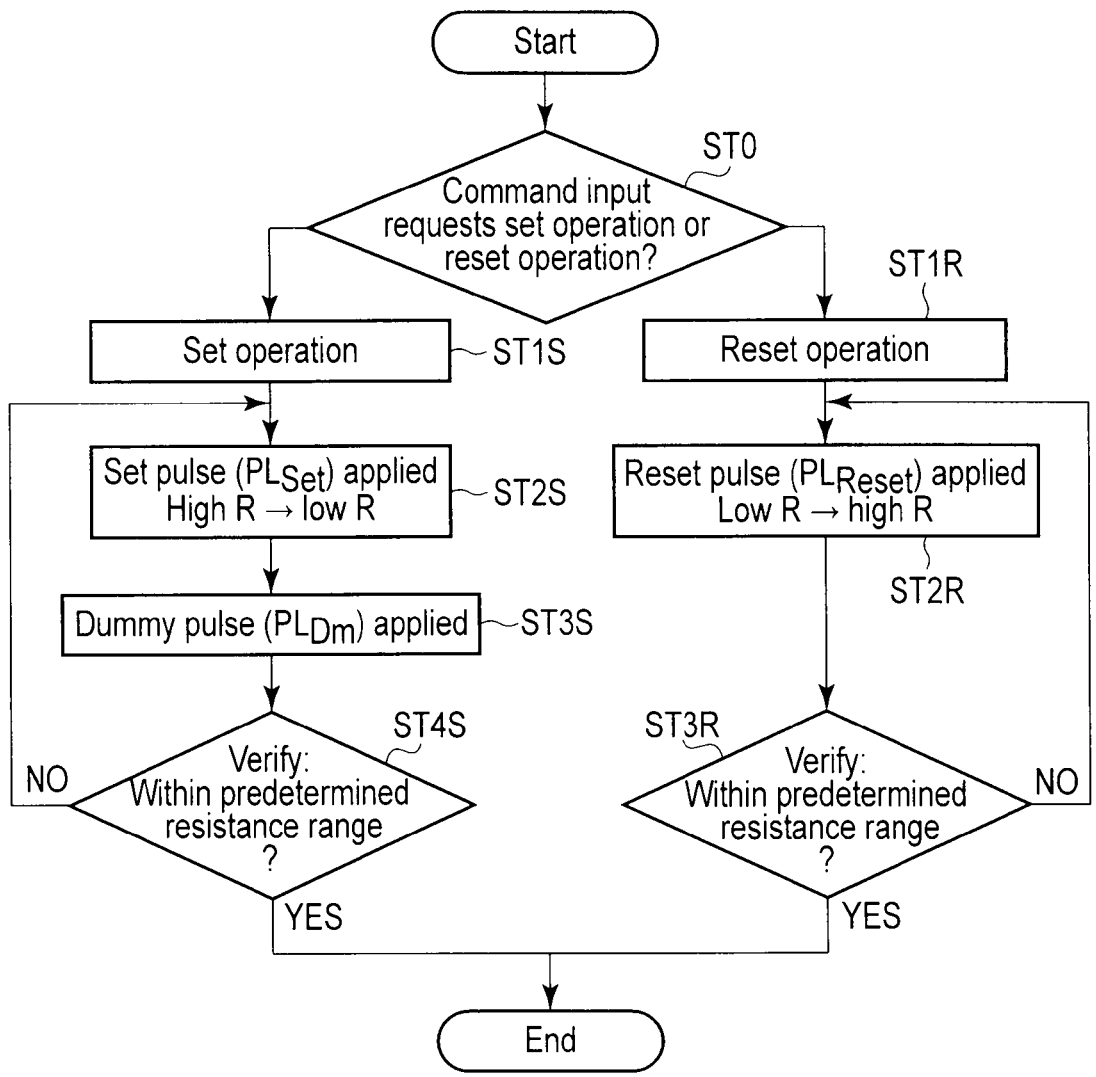
FIG. 9 is a flowchart showing an operation example of the resistance-change memory according to the first embodiment.

The set/reset operations of the resistance-change memory according to the present embodiment are described with reference to FIG. 9. FIG. 9 is a flowchart showing an operation example of the resistance-change memory according to the present embodiment. Here, the operation of the resistance-change memory is described with reference to FIG. 1, FIG. 4, FIG. 8A, and FIG. 8B as well.

Here, the cell unit targeted for the reset operation and the set operation is the cell unit CU connected to word line $WL_j$ and bit line $BL_i$ in FIG. 4. The cell unit targeted for operation is referred to as a selected cell unit, and the word line and bit line to which the selected cell unit is connected are referred to as a selected word line and a selected bit line, respectively. The cell units other than the selected cell unit are referred to as unselected cell units. The word lines other than the selected word line are referred to as unselected word lines, and the bit lines other than the selected bit line are referred to as unselected bit lines.

The set operation of the resistance-change memory is performed as follows.

As shown in FIG. 9, a command signal CMD from the external (e.g., a host or a memory controller) is input to the command interface 4 in the chip in FIG. 1 (step ST0). At the same time, data DT and an address signal ADR are input to the data input/output buffer 5 and the address buffer 6 from the external, respectively.

When the state machine 7 determines in accordance with the input signal that the set operation is requested, the state machine 7 performs the control of the circuits in the chip necessary for the set operation (step ST1S).

Under the control of the state machine 7, the column control circuit 2 drives bit lines $BL_{i-1}$, $BL_i$, $BL_{i+1}$ on the basis of a column address signal included in the address signal ADR. Similarly, the row control circuit 3 drives word lines $WL_{j-1}$, $WL_j$, $WL_{j+1}$ on the basis of a row address signal included in the address signal ADR.

Under the control of the state machine 7, the pulse generation circuit 8 sequentially generates pulses (e.g., voltage pulses) used for the set operation.

Predetermined pulses are respectively applied to bit lines $BL_i$ and word lines $WL_j$ so that a forward bias may be applied to the diode 30 in the selected cell unit (step ST2S).

The set pulse $PL_{Set}$ is supplied to the selected bit line $BL_i$. For example, the potential of the selected bit line $BL_i$ is set at the amplitude (potential) $V_{Set}$ of the set pulse $PL_{Set}$, and the potential of the selected word line $WL_j$ is set at ground potential Vss. As a result, the set pulse $PL_{Set}$ is applied to the resistance-change memory element 10 in the cell unit CU. As shown in FIG. 8A, the set pulse $PL_{Set}$ has the predetermined pulse width $W_{Set}$ and the predetermined amplitude (potential) $V_{Set}$. The amplitude $V_{Set}$ of the set pulse $PL_{Set}$ is set within a range of, for example, 2 to 10 V. The potential difference $V_{Set}$ is applied to the selected bit lines $BL_i$ and the selected cell unit CU in a period corresponding to the pulse width $W_{Set}$ of the set pulse $PL_{Set}$.

As a result of the supply of the set pulse $PL_{Set}$, the resistance state of the resistance-change memory element in the selected cell unit changes from the high- to the low-resistance state.

As one model of the change of the resistance state of the resistance-change memory element 10, the set pulse $PL_{Set}$ is applied to the resistance-change memory element 10 so that a filament (micro electric path) through which a current easily flows is formed in the resistance-change film 11 of the resistance-change memory element 10. As a result, the resistance state of the resistance-change memory element changes from the high- to the low-resistance state.

Predetermined pulses are applied to the unselected bit lines and the unselected word lines so that a reverse bias is applied to the diodes 30 in the unselected cell units in a period in which the set pulse $PL_{Set}$ is applied to the selected cell unit CU. For example, the potential of the unselected bit line is set at ground potential Vss (0 V) to about 0.5 V, and the potential of the unselected word line is set at a predetermined unselect potential (e.g., about 0 to 5 V).

However, in the unselected cell units (also referred to as half-selected cell units) connected to the selected bit line $BL_i$ and the unselected word lines $WL_{j-1}$ and $WL_{j+1}$, the potential difference (e.g., $V_{Set}-V_{Set}$) between the selected bit line and the unselected word line is controlled so that the potential difference between the terminals of these cell units may be substantially zero.

Similarly, in the unselected cell units (half-selected cell units) connected to the selected bit line $BL_i$ and the unselected bit lines $BL_{i-1}$ and $BL_{i+1}$, the potential difference (e.g., Vss−Vss) between the unselected bit line and the selected word line is controlled so that the potential difference between the terminals of these cell units may be substantially zero.

For example, the unselect potential applied to the unselected word lines to which the half-selected cell units are connected is set to be greater than or equal to the amplitude $PL_{Set}$ of the set pulse (however, the same polarity as the set pulse). The unselect potential applied to the unselected bit lines to which the half-selected cell units are connected is a potential of zero or a polarity opposite to that of the set pulse.

In this way, the reverse bias is applied to the diode in the unselected cell unit, or the potential difference applied to the unselected cell units (half-selected cell units) is reduced, so that the change of the resistance state of the resistance-change memory element in the unselected cell unit is prevented.

As shown in FIG. 8A and FIG. 9, in the resistance-change memory according to the present embodiment, the dummy pulse $PL_{Dm1}$ is supplied to the selected cell unit after the set pulse $PL_{Set}$ is supplied to the selected cell unit (step ST3S). The dummy pulse $PL_{Dm1}$ is supplied to the selected cell unit after a predetermined time $T_I$ has passed since the drop of the set pulse $PL_{Set}$. For example, the potential of the selected bit line $BL_i$ is set to the amplitude (potential) $V_{Dm}$ of the dummy pulse $PL_{Dm1}$, and the potential of the selected word line $WL_j$ is set at ground potential Vss.

The amplitude $V_{Dm}$ of the dummy pulse $PL_{Dm1}$ is smaller than the amplitude $V_{Set}$ of the set pulse $PL_{Set}$ and greater than the amplitude $V_{Rd}$ of the read pulse $PL_{Rd}$. An amplitude $V_{Dm1}$ of the dummy pulse is smaller than the amplitude $V_{Reset}$ of the reset pulse $PL_{Reset}$.

As a result of the supply of the dummy pulse $PL_{Dm1}$, a load is supplied to the resistance-change memory element 10 in the selected cell unit CU. When the dummy pulse $PL_{Dm1}$ is supplied to the resistance-change memory element 10, the resistance of the resistance-change memory element having poor data retention characteristics shifts to, for example, the high-resistance state.

In contrast, the resistance (resistance state) of the resistance-change memory element having sufficient data retention characteristics does not change even if the dummy pulse $PL_{Dm1}$ is supplied thereto. The reason is that the resistance-change memory element is resistant to the load of the dummy pulse $PL_{Dm1}$ owing to its high retention characteristics.

In a period (pulse width) $W_{Dm1}$ in which the dummy pulse $PL_{Dm1}$ is supplied to the selected cell unit, the potentials of the unselected bit lines and the unselected word lines are controlled so that 0 V or a reverse bias may be applied to the unselected cell units substantially as in the period in which the set pulse $PL_{Set}$ is supplied to the selected cell unit.

After a predetermined period $T_2$ has passed since the supply of the dummy pulse $PL_{Dm1}$ to the selected cell unit CU, verification is performed, for example, to determine whether predetermined data (here, binary 0) is written in the selected cell unit (step ST4S). The verification is performed by reading data from the selected cell unit CU. Therefore, as shown in FIG. 8A, the read pulse $PL_{Rd}$ is supplied to the selected cell unit after the dummy pulse $PL_{Dm1}$ is supplied to the selected cell unit. In the present embodiment, data reading for verification is referred to as verify read.

The read pulse $PL_{Rd}$ is set to the pulse width $W_{Rd}$ and the amplitude $V_{Rd}$ that do not change the resistance state of the resistance-change memory element 10. Thus, the amplitude $V_{Rd}$ of the read pulse $PL_{Rd}$ is sufficiently smaller than the amplitude $V_{Set}$ of the set pulse $PL_{Set}$. For example, the amplitude $V_{Rd}$ of the read pulse $PL_{Rd}$ is about 1 to 2 V, or less than or equal to 1 V.

If it is determined from the potential variation and current at the read node that the resistance of the resistance-change memory element 10 in the selected cell unit CU is not within the distribution of the low-resistance state corresponding to binary 0, the operations in steps ST2S to ST4S are performed again.

That is, the set pulse $PL_{Set}$ is again supplied to the selected cell unit CU, and then the dummy pulse $PL_{Dm1}$ is supplied to the selected cell unit CU. The verify read is then performed. At least one of the amplitude $V_{Set}$ and the pulse width $W_{Set}$ of the set pulse $PL_{Set}$ again applied to the memory element the resistance of which has been shifted by the dummy pulse may be changed.

As described above, the supply of the dummy pulse $PL_{Dm1}$ shifts the resistance of the resistance-change memory element having poor data retention characteristics to a value that does not indicate binary 0 (predetermined low resistance). Accordingly, during the set operation, the resistance-change memory elements having poor data retention characteristics (data retention ratio) are extracted by the verify read in step ST4S.

When it is determined from the current or the potential variation at the read node that the resistance of the resistance-change memory element in the selected cell unit is within the distribution of the low-resistance state corresponding to binary 0, the set operation ends.

For example, in the resistance-change memory according to the present embodiment, a cycle including the application of the set pulse $PL_{Set}$, the application of the dummy pulse $PL_{Dm1}$, and the verify read (the application of the read pulse $PL_{Rd}$) as in steps ST2S to ST4S of FIG. 8A and FIG. 9 is one operation cycle of the set operation.

The reset operation of the resistance-change memory according to the present embodiment is performed as follows.

As in the set operation described above, when the state machine 7 determines in accordance with an input command signal CMD that the reset operation is requested, the reset operation is performed (steps ST0, ST1R). Under the control of the state machine 7, the column control circuit 2 and the row control circuit 3 drive bit lines $BL_{i-1}$, $BL_i$, $BL_{i+1}$ and word lines $WL_{j-1}$, $WL_j$, $WL_{j+1}$ indicated by the column and row address signals of the address signal ADR, respectively. The pulse generation circuit 8 generates pulses used for the reset operation.

Predetermined pulses are respectively applied to bit lines $BL_i$ and word lines $WL_j$ so that a forward bias may be applied to the diode 30 in the selected cell unit CU (step ST2R).

The reset pulse $PL_{Reset}$ is supplied to the selected bit line $BL_i$. The potential of the selected word line $WL_j$ is set at ground potential Vss. The reset pulse $PL_{Reset}$ is applied to the resistance-change memory element 10 in the selected cell unit. As a result, the resistance state of the resistance-change memory element 10 changes from the low- to the high-resistance state.

As shown in FIG. 8B, the reset pulse $PL_{Reset}$ has a predetermined pulse width $W_{Reset}$ and a predetermined amplitude $V_{Reset}$. As described above, the amplitude $V_{Reset}$ of the reset pulse $PL_{Reset}$ is smaller than the amplitude $V_{Set}$ of the set pulse $PL_{Set}$. Depending on the magnitude of the amplitude $V_{Set}$ of the set pulse $PL_{Set}$, the amplitude $V_{Reset}$ of the reset pulse $PL_{Reset}$ is set within a range of, for example, 1 to 10 V.

As in the set operation, predetermined pulses (potentials) are applied to the unselected bit lines and the unselected word lines so that a reverse bias is applied to the diodes 30 in the unselected cell units while the reset pulse $PL_{Reset}$ is being supplied to the selected cell unit. For example, the potential of the unselected bit line is set at ground potential Vss to about 0.5 V, and the potential of the unselected word line is set at the unselect potential (e.g., Vss to 10 V).

Moreover, as in the set operation, in the half-selected cell units, the potential difference between the selected bit line and the unselected word line and the potential difference between the unselected bit line and the selected word line are controlled so that the potential difference between the terminals of these cell units may be substantially zero.

In the reset operation, after a predetermined period $T_3$ has passed since the supply of the reset pulse $PL_{Reset}$ to the selected cell unit, verification for the selected cell unit is performed without the supply of the dummy pulse (step ST3R).

The verify read verifies whether the resistance of the resistance-change memory element in the selected cell unit is within the distribution of the high-resistance state corresponding to binary 1.

When the resistance-change memory element 10 in the selected cell unit CU does not indicate the resistance corresponding to binary 1 (or the potential variation and current at the read node), the supply of the reset pulse $PL_{Reset}$ (step ST2R) and the verify read (step ST3R) are performed again. When the resistance-change memory element 10 in the selected cell unit CU indicates the resistance corresponding to binary 1, the reset operation ends.

For example, in the resistance-change memory according to the present embodiment, a cycle including the application of the reset pulse $PL_{Reset}$ and the verify read (the application of the read pulse $PL_{Rd}$) as in steps ST2R to ST3S of FIG. 8B and FIG. 9 is one operation cycle of the reset operation.

As described above, in the resistance-change memory according to the present embodiment, in the set operation, the dummy pulse $PL_{Dm1}$ is supplied to the resistance-change memory element 10 targeted for the set operation after the set pulse $PL_{Set}$ is supplied thereto. Further, for example, after the supply of the dummy pulse $PL_{Dm1}$, verification is performed by the supply of the read pulse $PL_{Rd}$.

The amplitude (potential difference) $V_{Dm1}$ of the dummy pulse $PL_{Dm1}$ is smaller than the amplitude $V_{Set}$ of the set pulse $PL_{Set}$ and greater than the amplitude $V_{Rd}$ of the read pulse $PL_{Rd}$. For example, the amplitude $V_{Dm}$ of the dummy pulse $PL_{Dm1}$ is smaller than the amplitude $V_{Reset}$ of the reset pulse $PL_{Reset}$.

FIG. 10A shows the relationship between the data retention ratio (%) of the resistance-change memory and time. The abscissa in FIG. 10A represents time, and the ordinate represents the data retention ratio of the resistance-change memory.

In FIG. 10A, a characteristic line P1 indicated by a solid line shows the change of the data retention ratio of the resistance-change memory according to the present embodiment. In FIG. 10A, a characteristic line P2 indicated by a broken line shows the change of the data retention ratio of the resistance-change memory that uses no dummy pulse. Time 0 indicates the time immediately after the set pulse is supplied. The data retention ratio is correlated with the resistance assigned to data. That is, the change of the data retention ratio depends on the degree of variation of the resistance of the resistance-change memory element after the supply of the set pulse.

If the data retention ratio is less than or equal to a predetermined value (hereinafter referred to as a specification value) SV in the resistance-change memory, it is determined that the number of memory elements that do not retain predetermined data has increased. For example, the specification value SV is a value that is obtained with reference to a read level or the lower limit and upper limit of a resistance corresponding to data. The specification value SV is set at, for example, a value which is about 90% of the obtained reference value.

The data retention ratio of the resistance-change memory may decrease to the specification value SV or less during the operation of the memory in response to the change of the resistance of the memory element (resistance-change film) with time. For example, there is a defect in which the resistance of the resistance-change memory element in the low-resistance state shifts to the high-resistance state as a result of the change of the operation temperature or an element defect.

The characteristic line P2 in FIG. 10A indicates the change of the data retention ratio of the resistance-change memory with time in a normal set operation without the supply of the dummy pulse.

For example, the data retention state of a certain resistance-change memory is less than or equal to the specification value SV at a certain time Tx. Suppose that the verify read is performed for this element before time Tx. In this case, since the verify read is performed before the data retention ratio of the resistance-change memory becomes less than or equal to the specification value SV, it is determined that the requested specification value is satisfied in the verify read before time Tx. However, the data retention ratio of the resistance-change memory becomes less than or equal to the specification value SV at time Tx. As a result, data read failure is caused in the read operation performed after data writing. Therefore, the reliability of the resistance-change memory decreases in the normal set operation that uses no dummy pulse.

In order to ensure the reliability of data writing (set operation) in the resistance-change memory element that may be less than or equal to the specification value SV at time Tx, the verify read for the set operation needs to be performed after time Tx. In this case, the operation speed of the resistance-change memory decreases.

In the resistance-change memory according to the present embodiment, as shown by the characteristic line P1 in FIG. 10A, when the dummy pulse is supplied the resistance-change memory element having poor retention characteristics becomes less than or equal to the specification value SV at time Ta earlier than when no dummy pulse is supplied. This is because the resistance of the resistance-change memory element having poor retention characteristics is changed by the load resulting from the dummy pulse. In contrast, because the amplitude (voltage) of the dummy pulse is smaller than the amplitudes of the set and reset pulses, the data retention ratio (resistance) of the memory element having satisfactory retention characteristics does not change even if the dummy pulse is applied to the resistance-change memory element having satisfactory retention characteristics.

In times Ta to Tx in FIG. 10A, the data retention ratio of the resistance-change memory can be improved by performing the verify read and re-supplying the set pulse.

As a result of the supply of the dummy pulse, the speed (time Ta) at which the data retention ratio of the resistance-change memory that may decrease in data retention ratio becomes less than or equal to the specification value is higher than the normal speed (time Tx) at which the data retention ratio is decreased by the change with time. Therefore, highly reliable verify read can be performed in a short time $T_{Set}$ from the supply of the set pulse in the operation example shown in FIG. 8A, as compared with the verify operation that takes the change of the data retention ratio with time into account. Thus, even if the dummy pulse is added to the operation cycle of the set operation, an excessive decrease in the operation speed of the resistance-change memory is inhibited.

Time Ta at which the data retention ratio of the resistance-change memory is brought to the specification value SV or less by the supply of the dummy pulse changes with the amplitude of the dummy pulse and the pulse width.

The reset operation changes the resistance state of the resistance-change memory element 10 from the low- to the high-resistance state. The failure in which the resistance state of the resistance-change memory element shifts from the high- to the low-resistance state is less likely to occur than the change from the low- to the high-resistance state with time. Therefore, the adverse effect of the decrease of the data retention ratio in the reset operation on the resistance-change memory is much less than that of the decrease of the data retention ratio in the set operation.

Thus, in the reset operation of the resistance-change memory, a requested specification of the data retention ratio can be ensured without using the dummy pulse. However, during the reset operation as well, the dummy pulse may be supplied to the selected resistance-change memory element after the reset pulse is supplied to this resistance-change memory element.

As described above, in the resistance-change memory according to the present embodiment, the dummy pulse $PL_{Dm1}$ is supplied to the resistance-change memory element in the selected cell unit after the set pulse $PL_{Set}$ is supplied to the resistance-change memory element in the selected cell unit, in the operation cycle of the set operation.

As a result, in the set operation, operation failures resulting from the decrease of the data retention ratio of the resistance-change memory element can be inhibited without an excessive decrease in the operation speed. Thus, the reliability of the resistance-change memory is improved in the present embodiment.

Consequently, according to the resistance-change memory of the present embodiment, the operation characteristics of the resistance-change memory can be improved.

(4) Amplitude and Width of Dummy Pulse

The amplitude $V_{Dm}$ and pulse width $W_{Dm}$ of the dummy pulse $PL_{Dm1}$ in the resistance-change memory according to the present embodiment is described with reference to FIG. 10B and FIG. 10C.

It should be understood that the amplitude $V_{Dm}$ and pulse width $W_{Dm}$ of the dummy pulse $PL_{Dm1}$ described here are illustrative only and vary depending on the material used for the resistance-change film 11 of the resistance-change memory element 10 and the characteristics of the non-ohmic element (diode) 30 in the cell unit. However, substantially similar tendencies are shown even if the material used for the element and the characteristics vary.

In the resistance-change memory, the maximum current that can flow through the resistance-change memory element in the low-resistance state is limited. If a current higher than this limit current (also referred to as a compliance current) flows through the resistance-change memory element in the low-resistance state, the filament in the resistance-change film is broken (or disappears), and the resistance-change memory element 10 changes to the high-resistance state. The intensity of this compliance current varies depending on the material/characteristics of the resistance-change memory element and the specification required for the resistance-change memory. Thus, the magnitude of the amplitude/width of the dummy pulse according to the present embodiment depends on the intensity of the compliance current.

FIG. 10B and FIG. 10C show the distribution of the existence probability of the resistance-change memory element when the dummy pulse is supplied after the resistance-change memory element has changed from the high- to the low-resistance state.

In FIG. 10B and FIG. 10C, the abscissa of each graph represents the current which flows through the resistance-change memory element (cell unit) when a pulse (e.g., a read pulse) that does not change the resistance state of the resistance-change memory element is applied to the cell unit. The current indicated on the abscissa is correlated with the resistance of the resistance-change memory element.

In FIG. 10B and FIG. 10C, a current $I_{Set}$ corresponds to the reference value of the resistance-change memory element in the low-resistance state (binary 0), and a current $I_{Reset}$ corresponds to the reference value of the resistance-change memory element in the high-resistance state (binary 1). A current that does not belong in a predetermined allowable range in which $I_{Set}$ is the reference value is regarded as indicating a resistance-change memory element in the high-resistance state or as a resistance-change memory element for which data cannot be determined.

In FIG. 10B and FIG. 10C, the ordinate represents the existence probability of the resistance-change memory element (cell unit) in the memory cell array at each current (resistance).

In FIG. 10B and FIG. 10C, characteristic lines A1 and A2 indicate distributions immediately after the supply of the set pulse to the resistance-change memory element, and characteristic lines B1 and B2 indicate distributions immediately after the supply of the dummy pulse to the resistance-change memory element. Characteristic lines C1 and C2 indicate distributions after about 10 seconds to 100 seconds since the supply of the dummy pulse to the resistance-change memory element.

In FIG. 10B and FIG. 10C, measurements are made in such a manner as to change the pulse width and amplitude of the dummy pulse. The width of the dummy pulse in FIG. 10C is set at about $10^3$ times to $10^4$ times the width of the dummy pulse in FIG. 10B. The amplitude of the dummy pulse in FIG. 10C is set at about 10 times to $10^2$ times the amplitude of the dummy pulse in FIG. 10B.

In the example shown in FIG. 10B, the pulse width $W_{Dm}$ of the dummy pulse is set at, for example, $10 \text{ ns} \leq W_{Dm} < 100 \text{ ns}$, and the amplitude $V_{Dm}$ of the dummy pulse is set at, for example, $0.1 \text{ V} \leq W_{Dm} < 1 \text{ V}$.

As indicated by the characteristic line A1 of FIG. 10B, the current flowing through the resistance-change memory element shows a value greater than or equal to the predetermined current $I_{Set}$ immediately after the supply of the set pulse. That is, the resistance-change memory element immediately after supplied with the set pulse is in the low-resistance state, and retains predetermined data (binary 0).

The dummy pulse having the above-mentioned set value (pulse shape) is supplied to the resistance-change memory element in the low-resistance state. As indicated by the characteristic line B1 immediately after the supply of the dummy pulse, the existence probability of the resistance-change memory element between current $I_{Set}$ and current $I_{Reset}$ is increased by the supply of the dummy pulse. That is, the supply of the dummy pulse to the resistance-change memory element shifts the resistance of the resistance-change memory element having poor retention characteristics from the low- to the high-resistance state.

On the other hand, the resistance-change memory element that ensures predetermined retention characteristics does not change from the low- to the high-resistance state even if the dummy pulse is supplied thereto.

As indicated by the characteristic line C1 of FIG. 10B, after a predetermined period (after 10 s to 100 s) has passed since the supply of the dummy pulse, the existence probability between current $I_{Set}$ and current $I_{Reset}$ increases further than in the distribution (characteristic line B1) immediately after the supply of the dummy pulse. As a result, it is found out that even if the dummy pulse is supplied, the resistance of the resistance-change memory element changes with time when the load of the dummy pulse that changes the resistance state of the resistance-change memory element is low.

The resistance-change memory element having a poor date retention can be extracted by the dummy pulse having the set condition used in FIG. 10B.

In the example shown in FIG. 10C, the pulse width $W_{Dm}$ of the dummy pulse is set at, for example, $10 \text{ μs} \leq W_{Dm} < 100 \text{ μs}$, and the amplitude $V_{Dm}$ of the dummy pulse is set at, for example, $1 \text{ V} \leq W_{Dm} < 10 \text{ V}$.

The dummy pulse having the set conditions used in FIG. 10C slightly changes from the characteristic line B1 to characteristic line C1 with time. That is, if the pulse width and amplitude of the dummy pulse is set in the set conditions in FIG. 10C, as compared with dummy pulse having the set condition used in FIG. 10B, most of the resistance-change memory elements that may not satisfy the predetermined specification of the data retention ratio can be extracted in a period (10 to 100 μs) shorter than the change with time (10 to 100 s).

Even if the pulse width and amplitude of the dummy pulse are more than the set conditions in FIG. 10B in the same manner as is the case with the pulse width and amplitude of the dummy pulse in FIG. 10C, the resistance of the resistance-change memory element that ensures predetermined retention characteristics is not considerably changed by the load of the dummy pulse.

Thus, according to the set conditions of the dummy pulse used in FIG. 10C, the effect of the supply of the dummy pulse after the supply of the set pulse is more notable than in the set conditions of FIG. 10B.

However, as described above, the dummy pulse used in the resistance-change memory according to the present embodiment is not limited to the amplitude and width of the dummy pulse used in FIG. 10B or FIG. 10C. Therefore, depending on the operation specification required for the resistance-change memory, one of the set values of the dummy pulses used in FIG. 10B and FIG. 10C may be used for the resistance-change memory, or a set value between the set values of FIG. 10B and FIG. 10C may be used for the resistance-change memory.

As described above, in the resistance-change memory according to the first embodiment, the dummy pulse is supplied to the resistance-change memory element after the set pulse is supplied to the resistance-change memory element, such that deterioration of the operation characteristics caused by a retention failure (the decrease of the data retention ratio) of the resistance-change memory can be inhibited.

Consequently, according to the resistance-change memory of the first embodiment, the operation characteristics of the resistance-change memory can be improved.

(5) Circuit Example

An example of a circuit configuration for generating the dummy pulse is described with reference to FIG. 11.

FIG. 11 shows an example of an internal configuration of the pulse generation circuit 8.

The pulse generation circuit 8 has the pulse supply units 80 connected to bit lines and word lines.

The column pulse supply unit 80 is connected to each of bit lines $BL_{i-1}$, $BL_i$, $BL_{i+1}$.

The pulse generation circuit 8 is connected to bit line $BL_i$ via a column selection switch (e.g., a field-effect transistor) SCL. The column selection switch SLC is allowed to conduct or prevented from conducting to control the connection between the pulse generation circuit 8 and bit line $BL_i$. The column selection switch SCL is provided in, for example, the column control circuit 2.

The pulse generation circuit 8 has one voltage source Vdd. The voltage source Vdd outputs a constant potential Vdd.

Resistors 81A, 81B, and 81C are connected in parallel between the voltage source Vdd and the column selection switch SCL. Resistors 81A, 81B, and 81C are connected between the voltage source Vdd and bit line $BL_i$ via field-effect transistors 82A, 82B, and 82C as switching elements, respectively.

Field-effect transistors 82A, 82B, and 82C are turned on/off to control the connection between the voltage source Vdd and resistors 81A, 81B, and 81C.

The voltage output by the voltage source Vdd is dropped by resistors 81A, 81B, and 81C. For example, resistor 81A has a resistance for generating the amplitude $V_{Set}$ of the set pulse $PL_{Set}$ from the voltage of the voltage source Vdd. Resistor 81B has a resistance for generating the amplitude $V_{Reset}$ of the reset pulse $PL_{Reset}$ from the voltage of the voltage source Vdd. Resistor 81C has a resistance for generating the amplitude $V_{Dm}$ of the dummy pulse $PL_{Dm1}$ from the voltage of the voltage source Vdd.

Thus, the voltage from the voltage source Vdd is dropped by resistors 81A, 81B, and 81C, thereby generating a pulse having a predetermined amplitude (voltage).

The width of each pulse is controlled by, for example, the period in which field-effect transistors 82A, 82B, and 82C connected between the voltage source Vdd and bit line $BL_i$ are turned on or the column selection switch SLC is turned on. As a result, a pulse having a predetermined pulse width is generated.

When one pulse is formed by one resistor, only one of transistors 82A, 82B, and 82C to which this resistor is connected is turned on, and one resistor is electrically connected to the voltage source Vdd. The remaining transistors 82A, 82B, and 82C are turned off, and the remaining resistors are electrically isolated from the voltage source Vdd.

However, when two or more of resistors 81A, 81B, and 81C connected in parallel serve as a resistance (combined resistance) for generating a pulse having a predetermined amplitude, two or more of transistors 82A, 82B, and 82C may be simultaneously turned on.

As shown in FIG. 11, the dummy pulse generator 80 is formed by at least one resistor 81C and at least one switching element 82C.

Therefore, in the resistance-change memory according to the first embodiment, the dummy pulse $PL_{Dm1}$ having a pulse shape different from those of the set/reset pulses and the read pulse can be generated.

The bit and word lines are also connected to a ground terminal (not shown) via switching elements (not shown) in the pulse generation circuit 8. Ground potential is applied to a predetermined bit line and word line during the operation of the resistance-change memory by controlling the conduction (turning on/off) of the switching elements. As described above, a potential of about 0.5 V may be applied to the unselected bit lines. In order to supply an unselect potential of about 0.5 V to the unselected bit lines, the pulse generation circuit 8 may be additionally provided with a resistor for dropping the voltage (potential) of the voltage source to about 0.5 V, and a switching element for controlling the connection between the resistor and the voltage source.

(B) Second Embodiment

A resistance-change memory according to a second embodiment is described with reference to FIG. 12. It is to be noted that the difference between the second embodiment and the first embodiment is described and common points are described when necessary.

FIG. 12 shows an example of the pulse shapes of a set pulses $PL_{Set}$ and a dummy pulse $PL_{DM2}$ in a set operation, in the resistance-change memory according to the second embodiment.

In the resistance-change memory according to the first embodiment, the dummy pulse $PL_{Dm1}$ is formed by one rectangular pulse.

On the other hand, in the resistance-change memory according to the second embodiment, one dummy pulse $PL_{DM2}$ includes multiple short pulses sPL. The short pulse sPL has a pulse width sW. The dummy pulse $PL_{DM2}$ has a pulse width $W_{Dm2}$.

The pulse width sW of the short pulse sPL is smaller than the pulse width $W_{Set}$ of the set pulse $PL_{Set}$, the pulse width $W_{Reset}$ of the reset pulse $PL_{Reset}$, and the pulse width $W_{Rd}$ of the read pulse $PL_{Rd}$.

As in the first embodiment, the amplitude $V_{Dm}$ of the short pulse sPL is smaller than the amplitude $V_{Set}$ of the set pulse $PL_{Set}$ and greater than the amplitude $V_{Rd}$ of the read pulse $PL_{Rd}$. For example, the amplitude $V_{Dm}$ of the short pulse sPL is smaller than the amplitude $V_{Reset}$ of the reset pulse $PL_{Reset}$.

In the present embodiment, the amplitude $V_{Dm}$ of each of the short pulses sPL included in the dummy pulse $PL_{DM2}$ may be different from one another to the extent that satisfies amplitude conditions relative to the above-mentioned other pulses.

Two short pulses sPL are adjacent to each other in a time sT. The period of one short pulse sPL is represented by sW+sT.

For example, when the circuit shown in FIG. 11 serves to generate a dummy pulse, the short pulse sPL included in the dummy pulse $PL_{DM2}$ is generated by turning on/off the transistor 82C in the dummy pulse generator 80 in accordance with the period (sW+sT) of the short pulse sPL.

As described above, in the resistance-change memory according to the second embodiment, even if the dummy pulse $PL_{DM2}$ is a short pulse group including the short pulses sPL, deterioration of the operation characteristics caused by the decrease of the data retention ratio in the set operation can be reduced as in the first embodiment.

In addition, in the resistance-change memory according to the second embodiment, the product of the period (sW+sT) of the short pulse sPL and the number of the short pulses sPL included in one dummy pulse $PL_{DM2}$ is set to be less than the amplitude $V_{Dm1}$ of the dummy pulse $PL_{Dm1}$ shown in FIG. 8. Thus, in the resistance-change memory according to the second embodiment, the time required for the set operation that includes the set pulse $PL_{Set}$ and the dummy pulse $PL_{DM2}$ can be shorter than in the resistance-change memory according to the first embodiment. This also makes it possible to contribute to the reduction of power consumption in the resistance-change memory.

As described above, according to the resistance-change memory in the second embodiment, the operation characteristics of the resistance-change memory can be improved.

(C) Third Embodiment

A resistance-change memory according to a third embodiment is described with reference to FIG. 13 to FIG. 17. The difference between the third embodiment and the first and second embodiments is mainly described and common points are described when necessary.

(a) Configuration

FIG. 13 shows an example of the pulse shapes of a set pulse $PL_{Set}$ and a dummy pulse $PL_{DM}$ in a set operation, in the resistance-change memory according to the third embodiment.

In the resistance-change memories according to the first and second embodiments, the dummy pulse $PL_{Dm1}$, $PL_{Dm2}$ is supplied to the selected cell unit after a predetermined time T1 has passed since the supply of the set pulse $PL_{Set}$ to the selected cell unit.

In the third embodiment, as shown in FIG. 13, there is no predetermined period provided between the set pulse $PL_{Set}$ and the dummy pulse $PL_{DM}$. The dummy pulse $PL_{DM}$ is continuous with the set pulse $PL_{Set}$. That is, the time for the start of the supply of the dummy pulse $PL_{DM}$ is set to be substantially the same as the time for the end of the supply of the set pulse $PL_{Set}$.

Therefore, in the resistance-change memory according to the third embodiment, the period required for the set operation can be shorter than in the resistance-change memories according to the first and second embodiments.

As in the present embodiment, even when a pulse $PL_{S/D}$ (hereinafter referred to as a set/dummy pulse $PL_{S/D}$) in which the dummy pulse $PL_{DM}$ is continuous with the set pulse $PL_{Set}$ is used for the set operation in the resistance-change memory, the potential difference $V_{Dm}$ of the dummy pulse $PL_{Dm}$ is applied to the resistance-change memory element 10 in the low-resistance state in a predetermined period $W_{Dm}$ after the potential difference (amplitude) $V_{Set}$ of the set pulse $PL_{Set}$ is applied to the resistance-change memory element 10 in a predetermined period (pulse width) $W_{Set}$.

Therefore, in the resistance-change memory according to the third embodiment as well, deterioration of the operation characteristics caused by the decrease of the data retention ratio in the set operation can be reduced as in the resistance-change memories according to the first and second embodiments.

Consequently, according to the resistance-change memory of the third embodiment, the operation characteristics of the resistance-change memory can be improved as in the first and second embodiments.

A circuit for generating the set/dummy pulse $PL_{S/D}$ shown in FIG. 13 and its operation are described below with reference to FIG. 14 to FIG. 17.

(b) Circuit Example 1

An example of the circuit for generating the pulse $PL_{S/D}$ in which the dummy pulse $PL_{DM}$ is continuous with the set pulse $PL_{Set}$ is described with reference to FIG. 14 and FIG. 15.

FIG. 14 is shows an example of the circuit for generating the set/dummy pulse $PL_{S/D}$.

As shown in FIG. 14, the set/dummy pulse $PL_{S/D}$ is generated by a circuit (hereinafter referred to as a set/dummy pulse generator) 80A including a capacitor (capacitance element) 60. The set/dummy pulse generator 80A is provided in the pulse generation circuit 8. However, the set/dummy pulse generator 80A may be provided in the column control circuit 2.

One set/dummy pulse generator 80A is provided in each of bit lines $BL_{i-1}$, $BL_i$, $BL_{i+1}$. However, the set/dummy pulse generator 80A may be shared by two or more bit lines depending on the circuit configuration and operation of the memory cell array.

The set/dummy pulse generator 80A shown in FIG. 14 includes one capacitor 60 and two switching elements SW1 and SW2.

One end (first terminal) of the capacitor (first capacitor) 60 is connected to, for example, a connection node between switching element SW1 and bit line $BL_i$. The other end (second terminal) of the capacitor 60 is connected to a ground terminal.

As shown in FIG. 3, the capacitor 60 is formed on the semiconductor substrate 51. The capacitor 60 has the semiconductor layer 61 in the semiconductor substrate 51, the insulating film 62 on the semiconductor layer 61, and the conductive layer 63 on the insulating film 62.

The capacitor 60 has, for example, a capacitance of 1 pF or less. When the capacitance of the capacitor 60 is 1 pF, the area of the capacitor 60 formed on the semiconductor substrate 51 is, for example, about 10 µm×20 µm. The capacitor 60 may be formed in the interconnect region 25 on the interlayer insulating film 58.

Switching element SW1 is, for example, a field-effect transistor.

One end of a current path of field-effect transistor SW1 is connected to bit line $BL_i$. The other end of the current path of field-effect transistor SW1 is connected to the voltage source Vdd via, for example, a resistor (not shown). A control signal SC is input to the gate of field-effect transistor SW1. Control signal SC is generated by using a logic circuit (hereinafter referred to as a clock modulator) $89_1$ in the chip to modulate an operation clock (global clock) CLK of the resistance-change memory.

While field-effect transistor SW1 is on, the set pulse $PL_{Set}$ is supplied to the selected bit line $BL_i$ and the capacitor 60 via field-effect transistor SW1. The charging of the capacitor 60 is controlled by turning on/off field-effect transistor SW1. Field-effect transistor SW1 is hereinafter referred to as a charging switch.

Switching element SW2 is, for example, a field-effect transistor.

One end of a current path of field-effect transistor SW2 is connected to one end of the capacitor 60. The other end of the current path of field-effect transistor SW2 is connected to the ground terminal. A control signal SD is input to the gate of field-effect transistor SW2. Control signal SD is generated by using a clock modulator $89_2$ to modulate the operation clock CLK, in the same manner as control signal SC.

Field-effect transistor SW2 is off in a period in which the set pulse $PL_{Set}$ is supplied to the capacitor 60. When field-effect transistor SW2 is turned on, the capacitor 60 is discharged to the ground terminal via field-effect transistor SW2. The discharging of the capacitor 60 is controlled by turning on/off field-effect transistor SW2. Field-effect transistor SW2 is hereinafter referred to as a discharging switch.

The operation of the set/dummy pulse generator 80A in the present circuit example is described below with reference to FIG. 14 and FIG. 15. In this example as well, a selected bit line is bit line $BL_i$, and a selected word line is word line $WL_j$.

FIG. 15 shows a timing chart of the operation of the resistance-change memory including the set/dummy pulse generator 80A in circuit example 1.

In the set operation, a selected column switching element (not shown) is turned on. At time $t_1$, control signal SC of the charging switch SW1 of the set/dummy pulse generator 80A is made high. As a result, the set pulse $PL_{Set}$ is supplied to bit line $BL_i$ via the charging switch SW1 and the column selection switch that are in an on-state. For example, the charging switch SW1 is turned on substantially simultaneously with the turning on of the column selection switch. The potential of the selected word line $WL_j$ is set at ground potential.

Control signal SD is made low, and the discharging switch SW2 is off.

The potentials of the unselected bit lines $BL_{i-1}$ and $BL_{i+1}$ and the unselected word lines $WL_{j-1}$ and $W_{j+1}$ are controlled so that a reverse bias may be applied to the diodes in the unselected cell units or so that the potential difference between the terminals of the unselected cell units may be substantially zero. A potential to apply reverse bias to the unselected cell units is applied to the unselected word lines at time $t_0$. Time $t_0$ may be before time $t_1$ or after time $t_1$ as long as the operation of the resistance-change memory is stable. The potentials of the unselected bit lines and $BL_{i+1}$ are set at, for example, ground potential to about 0.5 V.

The set pulse $PL_{Set}$ is supplied to the selected bit line (selected cell unit) $BL_i$, and also supplied to the capacitor 60 via the charging switch SW1. The capacitor 60 is charged by the set pulse $PL_{Set}$.

After a predetermined period has passed, control signal SC goes low, and the charging switch SW1 is turned off.

As a result, the supply of the set pulse $PL_{Set}$ from the voltage source Vdd is stopped.

However, even if the voltage source Vdd is electrically isolated from bit line $BL_i$, the capacitor 60 is charged to a potential difference substantially equal (amplitude $V_{Set}$) to the set pulse $PL_{Set}$. Thus, even if the selected bit line $BL_i$ is electrically isolated from the voltage source Vdd by the charging switch SW1 in an off state, the potential of bit line $BL_i$ does not change sharply.

The resistance state of the selected resistance-change memory element 10 is changed from the high- to the low-resistance state by the application of the potential difference $V_{Set}$ to the selected cell unit.

After a period corresponding to the pulse width $W_{Set}$ of the set pulse $PL_{Set}$ has passed, control signal SD is made high at time $t_2$. As a result, field-effect transistor SW2 serving as the discharging switch is turned on.

Accordingly, the capacitor 60 is discharged to the ground terminal via the discharging switch SW2 that is switched on. In response to the discharging of the capacitor 60, the potential difference (pulse amplitude) applied to the selected cell unit starts decreasing. As described above, word line $WL_j$ is set at ground potential, so that a discharge current of the capacitor 60 can also flow through the selected cell unit. However, if the current transfer capability of the field-effect transistor serving as the discharging switch SW2 is sufficiently high, the discharge current flowing through the selected cell unit is weak. Therefore, the discharge current of the capacitor 60 has no adverse effect on the resistance-change memory element.

If the amplitude (potential of the selected bit line) of the set/dummy pulse $PL_{S/D}$ reaches $V_{Dm}$ at time $t_3$ as a result of the discharging of the capacitor 60, control signal SD of field-effect transistor SW2 is made low, and field-effect transistor SW2 serving as the discharging switch is turned off.

After a period (e.g., a period from time $t_3$ to $t_4$) corresponding to pulse width $W_{Dm}$ of the dummy pulse $PL_{Dm}$ has passed, control signal SD is made high, and the discharging switch SW2 is turned on. Thus, substantially the whole charge stored in the capacitor 60 is released to the ground terminal via the discharging switch SW2. As a result, the potential difference between the selected bit line $BL_i$ and the selected word line $WL_j$ becomes substantially zero.

After the discharging of the capacitor 60 is completed, control signal SD is made low, and the discharging switch SW2 is turned off at time $t_5$.

Thus, the set/dummy pulse $PL_{S/D}$ in which the dummy pulse $PL_{DM}$ is continuous with the set pulse $PL_{Set}$ is supplied to the resistance-change memory element in the selected cell unit by charging and discharging the capacitor 60.

Thereafter, at time t7, the supply of the potential to the unselected word lines is stopped. Further, as in the operation described with reference to FIG. 9, verify read is performed, and the set operation ends.

As described above, in the resistance-change memory according to the third embodiment, the set/dummy pulse $PL_{S/D}$ in which the dummy pulse $PL_{DM}$ is continuous with the set pulse $PL_{Set}$ is generated by the pulse generator 80A including the capacitor 60 shown in FIG. 14.

This enables, in the resistance-change memory according to this circuit example, operation substantially similar to that when the set pulse $PL_{Set}$ is supplied to the selected cell unit and then the dummy pulse $PL_{DM}$ is supplied thereto.

In the circuit shown in FIG. 14, the dummy pulse $PL_{DM}$ is produced by the release of the charge which is stored in the capacitor 60 by the supply of the set pulse $PL_{Set}$. That is, the dummy pulse $PL_{DM}$ can be generated by using the set pulse $PL_{Set}$.

Therefore, according to this circuit example, the set pulse $PL_{Set}$ can be used to generate the dummy pulse $PL_{DM}$.

Thus, according to the pulse generator 80A shown in FIG. 14, there is no need to add an independent power supply to generate the dummy pulse. This makes it possible to contribute to the reduction of the circuit area of the resistance-change memory and the reduction of power consumption while providing the function to generate the dummy pulse.

Moreover, in this circuit example, the capacitor 60 is formed on the semiconductor substrate, thereby preventing the increase of the chip area and the decrease of storage density.

(c) Circuit Example 2

An example of the circuit for generating the set/dummy pulse $PL_{S/D}$ in which the dummy pulse $PL_{DM}$ is continuous with the set pulse $PL_{Set}$ is described with reference to FIG. 16 and FIG. 17. It is to be noted that the difference between this example and the example described with reference to FIG. 14 and FIG. 15 is mainly described here and common points are described when necessary.

As shown in FIG. 16, in this circuit example as well, the set/dummy pulse $PL_{S/D}$ is generated by a pulse generator 80B including capacitors 60A and 60B.

In the circuit example shown in FIG. 16, the set/dummy pulse $PL_{S/D}$ in which the dummy pulse $PL_{DM}$ is continuous with the set pulse $PL_{Set}$ is generated by charge sharing between capacitors 60A and 60B.

As shown in FIG. 16, the set/dummy pulse generator 80B includes two capacitors 60A and 60B and three switching elements (e.g., field-effect transistors) SW1, SW2, and SW3.

One end (first terminal) of capacitor (first capacitor) 60A is connected to a connection node between the charging switch SW1 and bit line $BL_i$. The other end (second terminal) of capacitor 60A is connected to a ground terminal.

One end (third terminal) of capacitor (second capacitor) 60B is connected to one end of capacitor 60A via switching element SW3. The other end (fourth terminal) of capacitor 60B is connected to the ground terminal.

One end of a current path of field-effect transistor SW3 as switching element SW3 is connected to one end of capacitor 60A. The other end of the current path of field-effect transistor SW3 is connected to one end of capacitor 60B. The other end of the current path of field-effect transistor SW3 is also connected to the ground terminal via the discharging switch SW2.

A control signal SS is input to the gate of field-effect transistor SW3. Control signal SS is generated by using a clock modulator $89_3$ to modulate the operation clock CLK of the memory, in the same manner as control signals SC and SD.

One end of field-effect transistor SW2 serving as the discharging switching element is connected to one end of capacitor 60B. The other end of field-effect transistor SW2 is connected to the ground terminal.

Field-effect transistor SW3 is turned off in a period in which capacitor 60A is charged. When the dummy pulse $PL_{DM}$ is generated, field-effect transistor SW3 is turned on. As a result, the charge stored in capacitor 60A is partially transferred to capacitor 60B via field-effect transistor SW3 that is turned on. That is, the charge is shared between capacitor 60A and capacitor 60B when field-effect transistor SW3 is turned on. The discharging switch SW2 is turned off while the charge is transferring from capacitor 60A to capacitor 60B.

When the capacitance of capacitor 60A is indicated by $C_1$ and the capacitance of capacitor 60B is indicated by $C_2$, a potential $V_{cell}$ applied to the selected cell unit after the charge sharing between capacitors 60A and 60B is represented by the following equation (1).

$$V_{cell} = \{C_1/(C_1+C_2)\} \times V_{Set} \quad (1)$$

The degrees of the capacitances $C_1$ and $C_2$ of capacitors 60A and 60B are set so that the potential $V_{cell}$ may be substantially equal to the magnitude of the amplitude $V_{Dm}$ of the dummy pulse.

Thus, the amplitude of the pulse $PL_{S/D}$ supplied to the selected cell unit is reduced from the amplitude $V_{Set}$ of the set pulse $PL_{Set}$ to the amplitude $V_{Dm}$ of the dummy pulse $PL_{Dm}$ by the charge sharing between capacitors 60A and 60B.

As described above, similarly to the set/dummy pulse generator 80A shown in FIG. 14, the set/dummy pulse generator 80B in this circuit example can generate the set/dummy pulse $PL_{S/D}$ in which the dummy pulse $PL_{DM}$ is continuous with the set pulse $PL_{Set}$ by the charge sharing between the capacitors.

Therefore, in the resistance-change memory according to this circuit example as well, substantially similar operation can be performed to that when the set pulse $PL_{Set}$ is supplied to the selected cell unit and then the dummy pulse $PL_{DM}$ is supplied thereto, as in the circuit shown in FIG. 14.

The operation of the set/dummy pulse generator 80B in circuit example 2 is described below with reference to FIG. 16 and FIG. 17.

Figure 17:
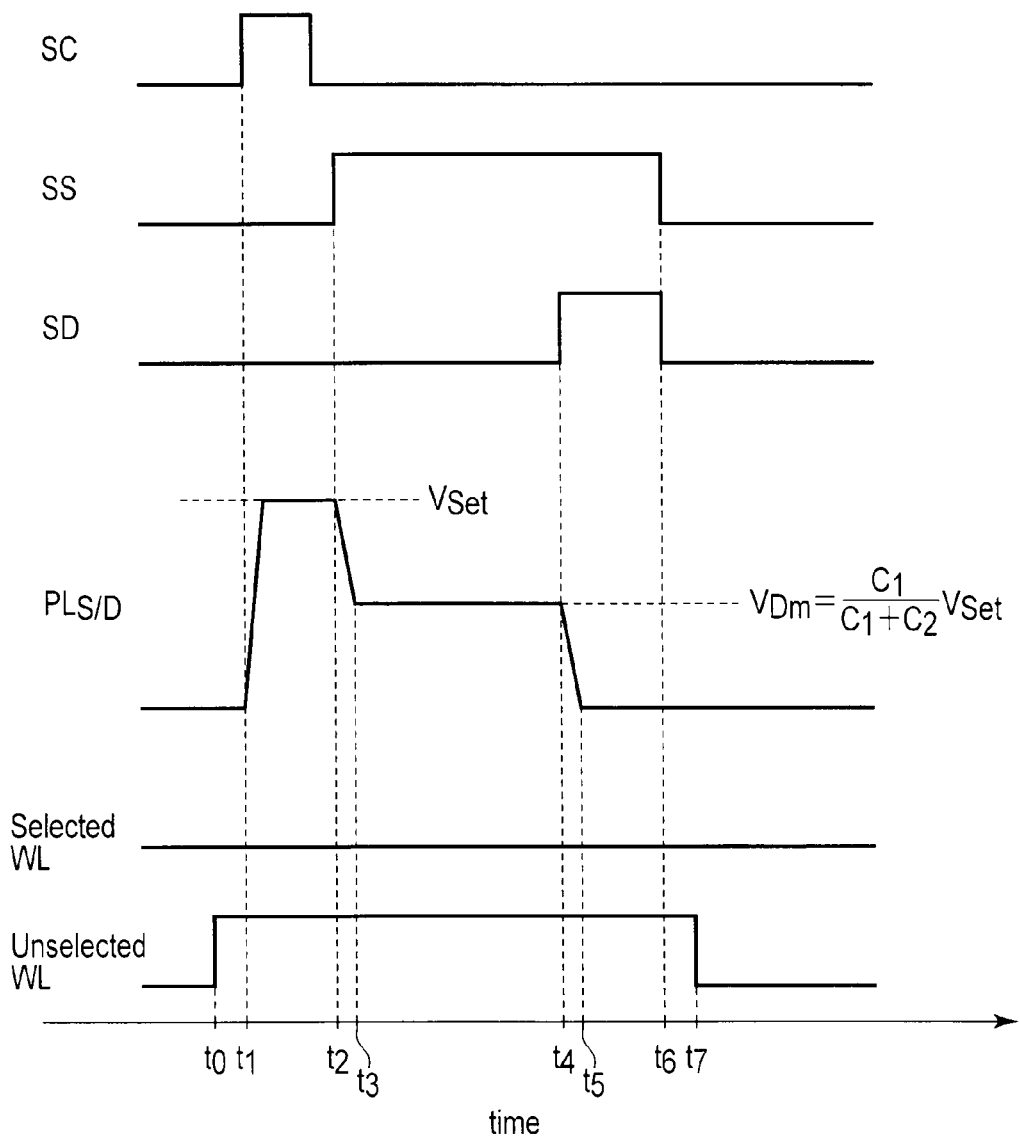
FIG. 17 is a timing chart showing the operation of the circuit shown in FIG. 16.

FIG. 17 shows a timing chart of the operation of the resistance-change memory including the set/dummy pulse generator 80B in circuit example 2.

As shown in FIG. 17, at time $t_0$, the potential of a selected word line, the potentials of unselected bit lines, and the potentials of unselected word lines are set to predetermined levels.

When control signal SC becomes high at time $t_1$, field-effect transistor SW1 serving as the charging switch is turned on. Control signals SS and SD are made low.

Substantially simultaneously with the turning on of the charging switch SW1, the column selection switch (not shown) is turned on. As a result, the set pulse $PL_{Set}$ is supplied to the selected cell unit, and capacitor 60A is charged by the set pulse $PL_{Set}$. In this case, the charge sharing switch SW3 is turned off, so that capacitor 60B is not charged.

The supply of the set pulse $PL_{Set}$ to the selected cell unit changes the resistance state of the resistance-change memory element from the high- to the low-resistance state.

After capacitor 60A is charged to about the voltage $V_{Set}$, control signal SC is made low, and the charging switch (field-effect transistor) SW1 is turned off.

As a result, the set pulse $PL_{Set}$ from the voltage source Vdd is not supplied to the selected bit line $BL_i$. However, as in the circuit example shown in FIG. 14, capacitor 60A is charged to about the voltage $V_{Set}$, so that the potential of the selected bit line $BL_i$ does not decrease sharply.

After a period corresponding to the pulse width $W_{Set}$ of the set pulse $PL_{Set}$ has passed, control signal SS is made high, for example, at time $t_2$. Thus, field-effect transistor SW3 serving as the charge sharing switch is turned on. The charge of capacitor 60A is transferred to capacitor 60B via field-effect transistor SW3 that is turned on, and charge is shared between capacitors 60A and 60B. In addition, the discharging switch SW2 is off.

In response to the charge sharing between capacitors 60A and 60B, the potential of bit line $BL_i$ decreases in accordance with the relationship represented by Equation 1, and a potential difference substantially equal to the amplitude $V_{Dm}$ of the dummy pulse $PL_{Dm}$ is applied to the selected cell unit. After the completion of the charge sharing, the charge sharing switch SW3 may remain turned on or may be once turned off.

After the charging potential $V_{Dm}$ of capacitor 60A is applied to the selected cell unit in a period corresponding to the pulse width $W_{Dm}$ of the dummy pulse $PL_{Dm}$, control signal SD is made high at time $t_4$. Field-effect transistor SW2 serving as the discharging switch is turned on, and the discharging of capacitors 60A and 60B is started. In this case, control signal SS is made high, and the charge sharing switch SW3 is turned on.

Thus, capacitor 60A is discharged to the ground terminal via field-effect transistors SW2 and SW3 that are turned on. Capacitor 60B is discharged to the ground terminal via field-effect transistor SW2.

For example, at time t5, the potential of the pulse $PL_{S/D}$ supplied to the selected bit line $BL_i$ becomes substantially zero.

Capacitors 60A and 60B and the selected cell unit may be electrically isolated from each other by turning off the column selection switch (not shown) from conducting to stop the application of the potential from capacitors 60A and 60B to the selected bit line $BL_i$.

At time t6, control signal SS and control signal SD are made low, and the charge sharing switch SW3 and the discharging switch SW2 are turned off.

Thereafter, at time t7, the supply of the potential to the unselected word lines is stopped. Further, as in the operation described with reference to FIGS. 8A and 9, verify read is performed, and the set operation ends. The order of deactivating (turning off) the charge sharing switch SW3, the discharging switch SW2, and word lines $WL_{j-1}$, $WL_j$, $WL_{j+1}$ from conducting is not limited to the above-mentioned order.

Similarly to the pulse generator 80A shown in FIG. 14, the pulse generator 80B shown in FIG. 16 can generate the set/dummy pulse $PL_{S/D}$ in which the dummy pulse $PL_{DM}$ is continuous with the set pulse $PL_{Set}$ by the charge sharing between capacitors 60A and 60B. Thus, the resistance-change memory shown in FIG. 16 can provide advantages similar to those provided by the circuit example shown in FIG. 14.

As described above, in the third embodiment, the resistance-change memory including the circuits shown in FIG. 14 and FIG. 16 can improve the operation characteristics of the resistance-change memory by applying the dummy pulse $PL_{DM}$ after the application of the set pulse $PL_{Set}$, as in the first and second embodiments.

According to the resistance-change memory in the third embodiment, the set operation is performed by using the pulse $PL_{S/D}$ in which the dummy pulse $PL_{DM}$ is continuous with the set pulse $PL_{Set}$, such that the operation of the resistance-change memory can be faster than in the first embodiment.

[Addition]

Figure 18:
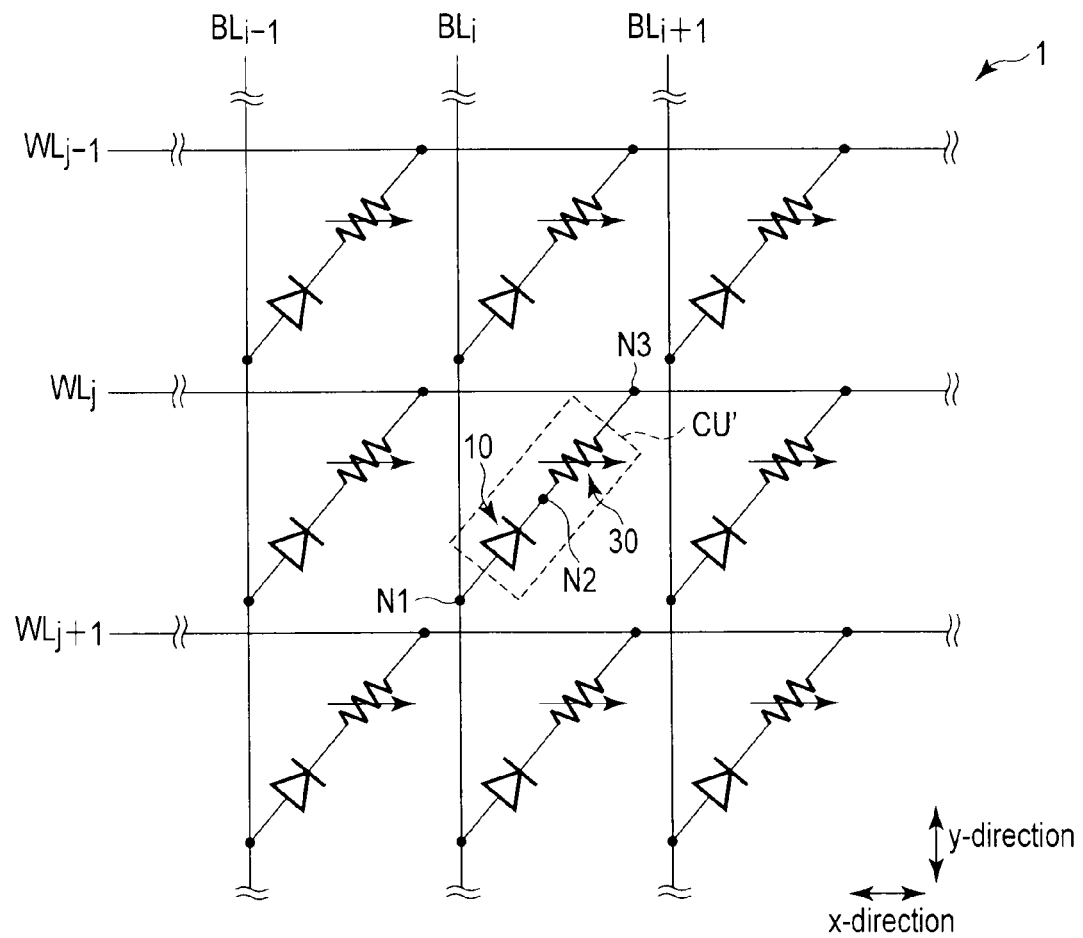
FIG. 18 is an equivalent circuit diagram showing a modification of the memory cell array.

In the resistance-change memories in the first to third embodiments, the cell unit CU including the resistance-change memory element 10 and the non-ohmic element (diode) 30 may be connected to bit lines $BL_{i-1}$, $BL_i$, $BL_{i+1}$ and word lines $WL_{j-1}$, $WL_j$, $WL_{j+1}$ as shown in FIG. 18.

As shown in FIG. 18, one end of the resistance-change memory element 10 is connected to word line $WL_j$, and the other end of the resistance-change memory element 10 is connected to one end (cathode) of the diode 30. The other end (anode) of the diode 30 is connected to bit line $BL_i$.

In this case, the stacking relationship of the resistance-change memory element 10 and the diode 30 is opposite to that of the structure of the cell unit shown in FIG. 5. That is, in the structure of the cell unit CU, the resistance-change memory element 10 is provided on control line 79, and the diode 30 is stacked on the resistance-change memory element 10. Control line 70 is provided on the diode 30.

Even if the resistance-change memory element 10 and the diode 30 are connected to bit line $BL_i$ and word line $WL_j$ as shown in FIG. 18, the set pulse and the dummy pulse can be supplied to the selected resistance-change memory element as in the operation shown in the first to third embodiments.

In the example described in the first to third embodiments, the set pulse/dummy pulse is applied to the selected bit line BL, and ground potential is applied to the selected word line. Conversely, the resistance-change memory according to the present embodiment may perform the above-described operation by applying the set pulse, the reset pulse, the read pulse, and the dummy pulse to the selected word line and applying ground potential to the selected bit line. In this case, the pulse generation circuit 8 having the dummy pulse generators 80, 80A, and 80B shown in FIG. 11, FIG. 14, and FIG. 16 is connected to the word line WL. Accordingly, the connection between the cell unit and the word/bit line is suitably changed. That is, the internal configuration of the memory cell array 1 is not limited to the configurations shown in FIG. 4 and FIG. 18. As long as the operation similar to that of the memory in each of the embodiments described above can be performed, the connection of the resistance-change memory element and the diode to the bit and word lines may be suitably changed. In accordance with this change of connection, the potentials of the bit and word lines during the operation of the memory may also be suitably changed. Advantages similar to those in the first to third embodiments can also be obtained in the resistance-change memory in which the set pulse/dummy pulse is applied to the selected word line WL.

It should be understood that the first to third embodiments can be applied to a memory having three or more distributions of resistances corresponding to data, such as a multivalued resistance-change memory.

In the first to third embodiments, the memory having the cross-point memory cell array has been described as an example of the resistance-change memory. However, it should be understood that in the resistance-change memory according to the embodiment, the memory cell array may be formed by a memory cell that includes at least one resistance-change memory element and at least one field-effect transistor.

Although the resistance-change memory for the unipolar operation has been illustrated to describe the operation of the resistance-change memory that uses the dummy pulse in the first to third embodiments, the dummy pulse described in the present embodiment may be used for the operation of the resistance-change memory for the bipolar operation.

A resistance-change memory (e.g., a ReRAM) in which a variable-resistance element serves as the memory element has been described in the first to third embodiments. However, it should be understood that the present embodiment can be applied to a resistance-change memory (PCRAM) in which a phase-change element serves as the memory element. By phase-change element is meant an element made of a material that is changed in crystal phase by energy applied thereto and changed in electrical characteristics such as resistance and capacitance by the phase change. A chalcogenide material (e.g., Ge—Sb—Te or In—Sb—Te) is used for the phase-change element (resistance-change film).

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A resistance-change memory comprising:
   first and second control lines;
   a memory element which is connected between the first and second control lines and in which its variable resistance state corresponds to data to be stored therein;
   a pulse generation circuit which generates a first pulse, a second pulse, a third pulse, and a fourth pulse, the first pulse having a first amplitude which changes the resistance state of the memory element from a high- to a low-resistance state, the second pulse having a second amplitude which changes the resistance state of the memory element from a low- to a high-resistance state, the third pulse having a third amplitude smaller than the first amplitude to read data in the memory element, the fourth pulse having a fourth amplitude between the first amplitude and the third amplitude; and
   a control circuit which controls the operations of the memory element and the pulse generation circuit,
   wherein the control circuit supplies the fourth pulse to the memory element after supplying the first pulse to the memory element.

2. The resistance-change memory according to claim 1, wherein the control circuit uses the third pulse to verify the data stored in the memory element after supplying the fourth pulse.

3. The resistance-change memory according to claim 1, wherein the amplitude of the fourth pulse is different from that of the second pulse.

4. The resistance-change memory according to claim 1, wherein the width of the fourth pulse is greater than or equal to the width of the first pulse.

5. The resistance-change memory according to claim 1, wherein the fourth pulse includes short pulses.

6. The resistance-change memory according to claim 1, wherein the fourth pulse is continuous with the first pulse.

7. The resistance-change memory according to claim 1, wherein the pulse generation circuit includes a first capacitor which has a first terminal connected to a first control line and a second terminal connected to a ground terminal, a first switching element connected between a voltage source and the first terminal, and a second switching element connected between the first terminal and a ground terminal.

8. The resistance-change memory according to claim 7, wherein the first switching element is turned on, and the first capacitor is charged by the first pulse output from the voltage source, and after the first capacitor is charged, the second switching element is turned on, the first capacitor is partially discharged, and the fourth pulse is generated.

9. The resistance-change memory according to claim 7, wherein the pulse generation circuit includes a third switching element connected between the first terminal and the second switching element, and a second capacitor which has a third terminal connected between the second switching element and the third switching element, and a fourth terminal connected to a ground terminal.

10. The resistance-change memory according to claim 9, wherein the first switching element is turned on, and the first capacitor is charged by the first pulse output from the voltage source, the first switching element is turned off, the third switching element is turned on, the charge of the first capacitor is transferred to the second capacitor, and the fourth pulse is generated.

11. The resistance-change memory according to claim 1, wherein when the memory element changed to the low-resistance state does not has a predetermined specification, the resistance of the memory element changed to the low-resistance state is shifted, by the application of the fourth pulse, out of a threshold distribution corresponding to the data to be stored.

12. The resistance-change memory according to claim 1, wherein the memory element is a variable-resistance element including a resistance-change film having a metal oxide.

13. An operating method of a resistance-change memory, the method comprising:

applying a first write pulse to a memory element in which its variable resistance state corresponds to data to be stored therein, the first write pulse having a first amplitude which changes the resistance state of the memory element from a high- to a low-resistance state; and applying a dummy pulse having a second amplitude smaller than the first amplitude after applying the first write pulse to the memory element.

14. The operating method of the resistance-change memory according to claim 13, wherein after the dummy pulse is applied, a read pulse having a third amplitude smaller than the second amplitude is applied, and data writing that uses the first write pulse is verified.

15. The operating method of the resistance-change memory according to claim 13, wherein when the memory element changed to the low-resistance state does not meet a predetermined specification, the resistance of the memory element changed to the low-resistance state is shifted, by the application of the dummy pulse, out of a threshold distribution corresponding to the data to be stored.

16. The operating method of the resistance-change memory according to claim 13, wherein the width of the dummy pulse is greater than or equal to the width of the first write pulse.

17. The operating method of the resistance-change memory according to claim 13, wherein the pulse shape of the dummy pulse is different from that of a second write pulse which changes the resistance state of the memory element from the low- to the high-resistance state.

18. The operating method of the resistance-change memory according to claim 13, wherein the dummy pulse includes short pulses.

19. The operating method of the resistance-change memory according to claim 13, wherein the dummy pulse is in contact with the first write pulse.

20. The operating method of the resistance-change memory according to claim 13, wherein the memory element is a variable-resistance element including a resistance-change film having a metal oxide.

* * * * *